United States Patent
Hisano et al.

(10) Patent No.: US 11,095,321 B2
(45) Date of Patent: Aug. 17, 2021

(54) MULTIPLEXER, RADIO-FREQUENCY FRONT-END CIRCUIT, AND COMMUNICATION APPARATUS

(71) Applicant: Murata Manufacturing Co., Ltd., Kyoto (JP)

(72) Inventors: Taizo Hisano, Kyoto (JP); Hideki Tsukamoto, Kyoto (JP); Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/855,401

(22) Filed: Apr. 22, 2020

(65) Prior Publication Data
US 2020/0252092 A1  Aug. 6, 2020

Related U.S. Application Data

(63) Continuation of application No. PCT/JP2018/037881, filed on Oct. 11, 2018.

(30) Foreign Application Priority Data

Oct. 24, 2017 (JP) .............................. JP2017-205195

(51) Int. Cl.
*H04B 1/00* (2006.01)
*H03H 7/46* (2006.01)
(Continued)

(52) U.S. Cl.
CPC ........... *H04B 1/0057* (2013.01); *H03H 7/463* (2013.01); *H03H 9/725* (2013.01); *H04B 1/18* (2013.01); *H04B 1/40* (2013.01)

(58) Field of Classification Search
CPC combination set(s) only.
See application file for complete search history.

(56) References Cited

U.S. PATENT DOCUMENTS 9,893,752 B2 * 2/2018 Domino ............... H03G 3/3068
2012/0195351 A1 * 8/2012 Banwell ................. H04B 1/525
375/219
(Continued)

FOREIGN PATENT DOCUMENTS

| JP | 2006-128881 A | 5/2006 |
|---|---|---|
| JP | 2014-225794 A | 12/2014 |
| WO | 2017-138539 A | 8/2017 |

OTHER PUBLICATIONS

International Search Report issued in Patent Application No. PCT/JP2018/037881 dated Dec. 11, 2018.
(Continued)

*Primary Examiner* — Junpeng Chen
(74) *Attorney, Agent, or Firm* — Pearne & Gordon LLP

(57) ABSTRACT

A multiplexer capable of concurrently sending a radio-frequency signal in one of Band A and Band B belong to a low band group and a radio-frequency signal in a Band C belongs to a high band group that includes: a common terminal and input/output terminals; a low-pass filter arranged between the common terminal and the input/output terminal and whose pass band is frequencies in the low band group and whose attenuation band is frequencies in the high band group; and a high-pass filter arranged between the common terminal and the input/output terminal and whose pass band is the frequencies in the high band group and whose attenuation band is the frequencies in the low band group. The low-pass filter includes a first frequency-variable circuit including a switch, and at least one of the pass band and the attenuation band of the low-pass filter is changeable.

10 Claims, 14 Drawing Sheets

(51) Int. Cl.
*H03H 9/72* (2006.01)
*H04B 1/18* (2006.01)
*H04B 1/40* (2015.01)

(56) References Cited

U.S. PATENT DOCUMENTS

| | | | |
|---|---|---|---|
| 2012/0243446 A1* | 9/2012 | Mueller | H04B 1/0057 |
| | | | 370/280 |
| 2014/0092795 A1 | 4/2014 | Granger-Jones | |
| 2017/0063404 A1 | 3/2017 | Langer et al. | |
| 2017/0077983 A1* | 3/2017 | Ella | H03H 7/465 |
| 2017/0093554 A1* | 3/2017 | Ebihara | H04L 49/25 |
| 2017/0244538 A1* | 8/2017 | Chang | H04L 5/0041 |
| 2018/0123619 A1* | 5/2018 | Bradley | H04L 5/14 |
| 2018/0343000 A1 | 11/2018 | Nosaka | |

OTHER PUBLICATIONS

Written Opinion issued in Patent Application No. PCT/JP2018/037881 dated Dec. 11, 2018.

* cited by examiner

MULTIPLEXER, RADIO-FREQUENCY FRONT-END CIRCUIT, AND COMMUNICATION APPARATUS

This is a continuation of International Application No. PCT/JP2018/037881 filed on Oct. 11, 2018 which claims priority from Japanese Patent Application No. 2017-205195 filed on Oct. 24, 2017. The contents of these applications are incorporated herein by reference in their entireties.

BACKGROUND

Technical Field

The present disclosure relates to a multiplexer, a radio-frequency front-end circuit, and a communication apparatus.

In recent years, mobile communication terminals are required to support a plurality of frequency bands, or so-called multiband, with a single terminal, and also a front-end circuit arranged between an antenna element and an amplifier is required to support multiband. Along with this, in order to maintain the signal quality in each frequency band, a diplexer is arranged between an antenna element and a filter supporting each frequency band in the front-end circuit.

Patent Document 1 discloses a circuit configuration of a diplexer including a low-pass filter and a high-pass filter connected to a common terminal. At least one of the low-pass filter and the high-pass filter includes an LC parallel resonance circuit. Thus, compared with a diplexer that demultiplexes a signal only by using a notch circuit, the pass band can be widened.

Patent Document 1: Japanese Unexamined Patent Application Publication No. 2006-128881

BRIEF SUMMARY

In the above diplexer of the related art, for example, a first frequency band group including a plurality of frequency bands and a second frequency band group including a plurality of frequency bands are demultiplexed or multiplexed.

However, with the diplexer of the related art, in a case of carrier aggregation (CA) mode in which a frequency band that belongs to the first frequency band group and a frequency band that belongs to the second frequency band group are concurrently used, if combination of the two concurrently used frequency bands is changed, the frequency interval between the two frequency bands or the frequency of a boundary band between the two frequency bands is changed. In this case, in particular, at least one of the two frequency bands approaches the higher end of the pass band of the low-pass filter or the lower end of the pass band of the high-pass filter, at which insertion loss is increased. Depending on the frequency interval or the boundary band, this increases the insertion loss of the pass band in at least one of the two frequency bands or degrades demultiplexing characteristics.

The present disclosure provides a multiplexer, a radio-frequency front-end circuit, and a communication apparatus in which increase in insertion loss or degradation of demultiplexing characteristics in CA mode is suppressed.

A multiplexer according to an aspect of the present disclosure is a multiplexer that is capable of concurrently sending a radio-frequency signal in one of a first frequency band and a second frequency band which belong to a first frequency band group and a radio-frequency signal in a third frequency band which belongs to a second frequency band group and that exclusively sends a radio-frequency signal in the first frequency band and a radio-frequency signal in the second frequency band, and includes: a first common terminal, a first input/output terminal, and a second input/output terminal; a first filter that is arranged between the first common terminal and the first input/output terminal and whose pass band is frequencies in the first frequency band group and whose attenuation band is frequencies in the second frequency band group; and a second filter that is arranged between the first common terminal and the second input/output terminal and whose pass band is the frequencies in the second frequency band group and whose attenuation band is the frequencies in the first frequency band group. The first filter includes a first frequency-variable circuit including a first switching element. In accordance with connection or disconnection of the first switching element, at least one of the pass band and the attenuation band of the first filter is changeable.

For example, (1) in a case where the first frequency band that belongs to the first frequency band group and the third frequency band that belongs to the second frequency band group are concurrently used and (2) in a case where the second frequency band that belongs to the first frequency band group and the third frequency band that belongs to the second frequency band group are concurrently used, the frequency interval between two concurrently used frequency bands differs.

According to the above configuration, in accordance with one of connection and disconnection of the first switching element, at least one of the pass band and the attenuation band of the first filter is changeable. Thus, for example, (1) in a case where the frequency interval between two concurrently used frequency bands is small, the pass band of the first filter is made closer to the pass band of the second filter. This can suppress increase in insertion loss on the pass band side of the second filter in the pass band of the first filter. In addition, in accordance with the other of connection and disconnection of the first switching element, for example, (2) in a case where the frequency interval between two concurrently used frequency bands is large, the attenuation band of the first filter, located between the pass band of the first filter and the pass band of the second filter, is made closer to the pass band of the first filter. This can increase the isolation between the first filter and the second filter.

Accordingly, even if the frequency band to be selected is changed in the multiplexer executing carrier aggregation (CA) between the so-called first frequency band group and the second frequency band group, it is possible to suppress increase in insertion loss or degradation of demultiplexing characteristics.

At least part of the second frequency band may be located between the first frequency band and the third frequency band. In accordance with connection or disconnection of the first switching element, (1) in a case of sending a radio-frequency signal in the second frequency band, an end of the pass band of the first filter on the second frequency band group side may shift to the second frequency band group side, and (2) in a case of sending a radio-frequency signal in the first frequency band, an end of the attenuation band of the first filter, the attenuation band being located between the pass band of the first filter and the pass band of the second filter, on the first frequency band group side may shift to the first frequency band group side.

According to the above configuration, in accordance with one of connection and disconnection of the first switching element, for example, (1) in a case where a radio-frequency signal in the second frequency band is used, the pass band of the first filter is made closer to the pass band of the second filter. This can suppress increase in insertion loss on the pass band side of the second filter in the pass band of the first filter. In addition, in accordance with the other of connection and disconnection of the first switching element, for example, (2) in a case where a radio-frequency signal in the first frequency band is used, the attenuation band of the first filter, located between the pass band of the first filter and the pass band of the second filter, is made closer to the pass band of the first filter. This can increase the isolation between the first filter and the second filter.

Accordingly, even if the frequency band to be selected is changed in the multiplexer executing CA between the first frequency band and the third frequency band and CA between the second frequency band and the third frequency band, it is possible to suppress increase in insertion loss or degradation of demultiplexing characteristics.

The first frequency-variable circuit may be connected between a node and ground, the node being on a path connecting the first common terminal and the first input/output terminal. The first frequency-variable circuit may further include an LC series circuit in which an inductor and a capacitor are connected in series. The first switching element may be connected to a connection node of the inductor and the capacitor and to any of ends of the LC series circuit.

Accordingly, the presence or absence of an attenuation pole of the first filter or the frequency of the attenuation pole is changeable. Thus, it is possible to change (1) the frequency of the pass band of the first filter, (2) the sharpness on the second frequency band group side of the pass band of the first filter, and (3) the frequency of the attenuation band of the first filter, the attenuation band being located between the pass band of the first filter and the pass band of the second filter. This can maintain insertion loss or an attenuation amount in accordance with required characteristics during CA.

The first frequency band group may be lower than the second frequency band group in frequency. The first filter may be a low-pass filter including an inductor arranged in series on a path connecting the first common terminal and the first input/output terminal. The second filter may be a high-pass filter including a capacitor arranged in series on a path connecting the first common terminal and the second input/output terminal.

This can suppress increase in insertion loss of the first filter constituted by an LC filter or degradation of isolation.

The first frequency band group may be higher than the second frequency band group in frequency. The first filter may be a high-pass filter including a capacitor arranged in series on a path connecting the first common terminal and the first input/output terminal. The second filter may be a low-pass filter including an inductor arranged in series on a path connecting the first common terminal and the second input/output terminal.

This can suppress increase in insertion loss of the first filter constituted by an LC filter or degradation of isolation.

The first frequency band group may include the first frequency band and the second frequency band. The second frequency band group may include the third frequency band and a fourth frequency band. The multiplexer (1) may exclusively send a radio-frequency signal in the first frequency band and a radio-frequency signal in the second frequency band, (2) may exclusively send a radio-frequency signal in the third frequency band and a radio-frequency signal in the fourth frequency band, and (3) may be capable of concurrently sending a radio-frequency signal in one of the first frequency band and the second frequency band and a radio-frequency signal in one of the third frequency band and the fourth frequency band. The second filter may include a second frequency-variable circuit including a second switching element. In accordance with connection or disconnection of the second switching element, at least one of the pass band and the attenuation band of the second filter may be changeable.

For example, (1) in a case where the third frequency band that belongs to the second frequency band group and the first frequency band that belongs to the first frequency band group are concurrently used and (2) in a case where the fourth frequency band that belongs to the second frequency band group and the first frequency band that belongs to the first frequency band group are concurrently used, the frequency interval between two concurrently used frequency bands differs.

According to the above configuration, in accordance with one of connection and disconnection of the second switching element, at least one of the pass band and the attenuation band of the second filter is changeable. Thus, for example, (1) in a case where the frequency interval between two concurrently used frequency bands is small, the pass band of the second filter is made closer to the pass band of the first filter. This can suppress increase in insertion loss on the pass band side of the first filter in the pass band of the second filter. In addition, in accordance with the other of connection and disconnection of the second switching element, for example, (2) in a case where the frequency interval between two concurrently used frequency bands is large, the attenuation band of the second filter, located between the pass band of the second filter and the pass band of the first filter, is made closer to the pass band of the second filter. This can increase the isolation between the first filter and the second filter.

Furthermore, since both the first filter and the second filter are frequency-variable, whatever combination is selected in CA using any of the first frequency band and the second frequency band and any of the third frequency band and the fourth frequency band, the pass bands and the attenuation bands of the first filter and the second filter can be optimized.

Accordingly, even if the frequency band to be selected is changed in the multiplexer executing CA between the so-called first frequency band group and the second frequency band group, it is possible to suppress increase in insertion loss or degradation of the isolation.

At least part of the third frequency band may be located between the second frequency band and the fourth frequency band. In accordance with connection or disconnection of the first switching element and the second switching element, (1) in a case of sending a radio-frequency signal in the first frequency band and a radio-frequency signal in the third frequency band, an end of the attenuation band of the first filter, the attenuation band being located between the pass band of the first filter and the pass band of the second filter, on the first frequency band group side may shift to the first frequency band group side and an end of the pass band of the second filter on the first frequency band group side may shift to the first frequency band group side, (2) in a case of sending a radio-frequency signal in the second frequency band and a radio-frequency signal in the fourth frequency band, an end of the attenuation band of the second filter, the attenuation band being located between the pass band of the first filter and the pass band of the second filter, on the second frequency band group side may shift to the second frequency band group side and an end of the pass band of the first filter on the second frequency band group side may shift to the second frequency band group side, (3) in a case of sending a radio-frequency signal in the second frequency band and a radio-frequency signal in the third frequency band, an end of the pass band of the first filter on the second frequency band group side may shift to the second frequency band group side and an end of the pass band of the second filter on the first frequency band group side may shift to the first frequency band group side, and (4) in a case of sending a radio-frequency signal in the first frequency band and a radio-frequency signal in the fourth frequency band, an end of the attenuation band of the first filter, the attenuation band being located between the pass band of the first filter and the pass band of the second filter, on the first frequency band group side may shift to the first frequency band group side and an end of the attenuation band of the second filter, the attenuation band being located between the pass band of the first filter and the pass band of the second filter, on the second frequency band group side may shift to the second frequency band group side.

According to the above configuration, in accordance with connection or disconnection of the first switching element and the second switching element, (1) in a case where radio-frequency signals in the first frequency band and the third frequency band are concurrently used, (2) in a case where radio-frequency signals in the second frequency band and the fourth frequency band are concurrently used, (3) in a case where radio-frequency signals in the second frequency band and the third frequency band are concurrently used, and (4) in a case where radio-frequency signals in the first frequency band and the fourth frequency band are concurrently used, at least one of insertion loss of the first filter, insertion loss of the second filter, and the isolation between the first filter and the second filter can be improved.

Accordingly, even if the frequency band to be selected is changed in the multiplexer executing CA of the above (1) to (4), it is possible to suppress increase in insertion loss or degradation of demultiplexing characteristics.

A radio-frequency front-end circuit according to an aspect of the present disclosure includes: any of the above multiplexers; a third switch including a second common terminal, a first selection terminal, and a second selection terminal, in which the second common terminal is connected to the first input/output terminal; a third filter that is connected to the first selection terminal and whose pass band is the first frequency band; a fourth filter that is connected to the second selection terminal and whose pass band is the second frequency band; a fifth filter that is connected to the second input/output terminal and whose pass band is the third frequency band; a first amplifier circuit connected to the third filter and the fourth filter; and a second amplifier circuit connected to the fifth filter.

Accordingly, it is possible to provide a radio-frequency front-end circuit in which increase in insertion loss or degradation of demultiplexing characteristics is suppressed even if the frequency band to be selected is changed in executing CA between two frequency bands that belong to the so-called first frequency band group and a frequency band that belongs to the second frequency band group.

A radio-frequency front-end circuit according to an aspect of the present disclosure includes: any of the above multiplexers; a third switch including a second common terminal, a first selection terminal, and a second selection terminal, in which the second common terminal is connected to the first input/output terminal; a fourth switch including a third common terminal, a third selection terminal, and a fourth selection terminal, in which the third common terminal is connected to the second input/output terminal; a third filter that is connected to the first selection terminal and whose pass band is the first frequency band; a fourth filter that is connected to the second selection terminal and whose pass band is the second frequency band; a fifth filter that is connected to the third selection terminal and whose pass band is the third frequency band; a sixth filter that is connected to the fourth selection terminal and whose pass band is the fourth frequency band; a first amplifier circuit connected to the third filter and the fourth filter; and a second amplifier circuit connected to the fifth filter and the sixth filter.

Accordingly, it is possible to provide a radio-frequency front-end circuit in which increase in insertion loss or degradation of demultiplexing characteristics is suppressed even if the frequency band to be selected is changed in executing CA between two frequency bands that belong to the so-called first frequency band group and two frequency bands that belong to the second frequency band group.

A communication apparatus according to an aspect of the present disclosure includes: an RF signal processing circuit that processes a radio-frequency signal received by an antenna element; and the above radio-frequency front-end circuit that sends the radio-frequency signal between the antenna element and the RF signal processing circuit.

Accordingly, it is possible to provide a communication apparatus in which increase in insertion loss or degradation of demultiplexing characteristics is suppressed even if the frequency band to be selected is changed in executing CA between the so-called first frequency band group and the second frequency band group.

According to the present disclosure, it is possible to provide a multiplexer, a radio-frequency front-end circuit, and a communication apparatus in which increase in insertion loss or degradation of demultiplexing characteristics in CA mode is suppressed.

BRIEF DESCRIPTION OF THE SEVERAL VIEWS OF THE DRAWINGS

FIG. 5C illustrates a circuit configuration of a low-pass filter according to Example 4a.

FIG. 7C illustrates a circuit configuration of a high-pass filter according to Modification 1a.

DETAILED DESCRIPTION

Now, embodiments of the present disclosure will be described below in detail with reference to Examples, Modifications, and Drawings. Note that Examples and Modifications described below indicate general or specific examples. The numeric values, shapes, materials, components, arrangement and connection of components, and the like in the following Examples and Modifications are examples and do not limit the present disclosure. Among the components in the following Examples and Modifications, components that are not described in independent claims are optional components. In addition, the components in Drawings are not to scale.

First Embodiment

[1.1 Configuration of Communication Apparatus]

Figure 1A:
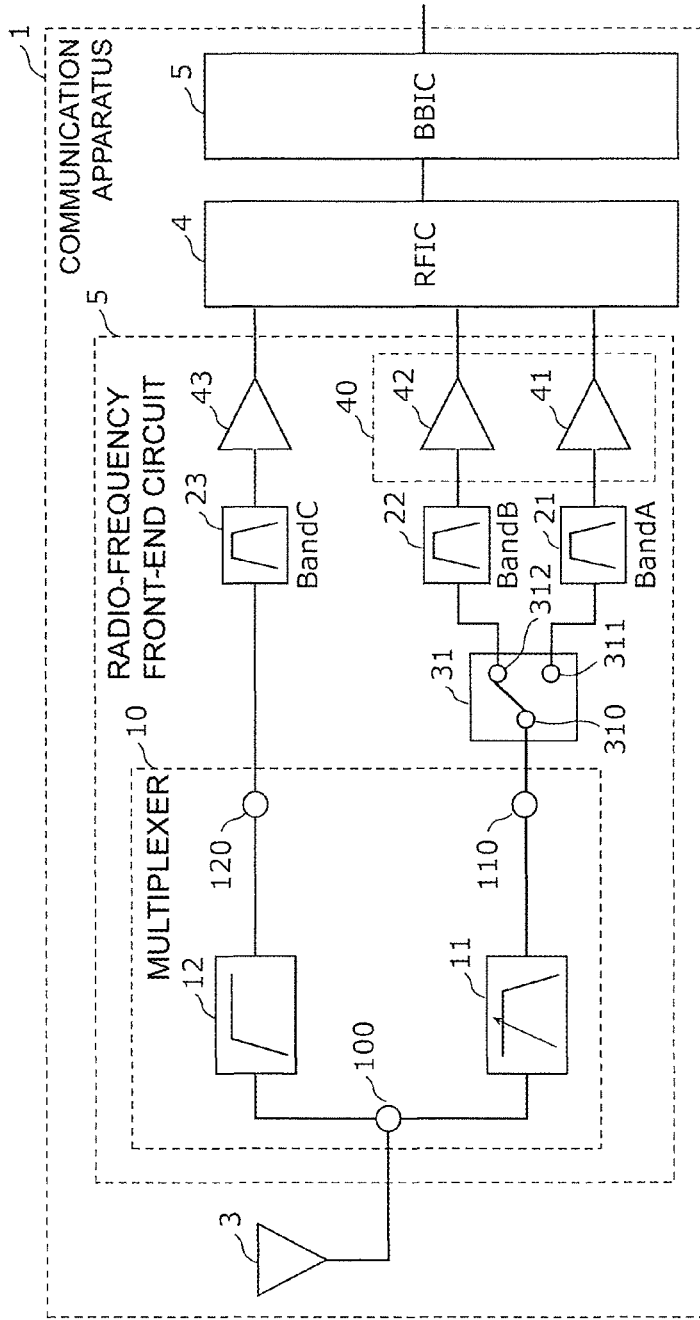
FIG. 1A illustrates a circuit configuration of a communication apparatus according to a first embodiment.

FIG. 1A illustrates a circuit configuration of a communication apparatus 1 according to a first embodiment. As illustrated in FIG. 1A, the communication apparatus 1 includes an antenna element 3, a radio-frequency front-end circuit 50, an RF signal processing circuit (RFIC) 4, and a baseband signal processing circuit (BBIC) 5.

The RFIC 4 is an RF signal processing circuit that processes radio-frequency signals transmitted and received by the antenna element 3. Specifically, the RFIC 4 performs signal processing on a radio-frequency signal (herein, radio-frequency reception signal) that is input from the antenna element 3 via the radio-frequency front-end circuit 50 by, for example, down-converting the radio-frequency signal, and outputs a reception signal generated by the signal processing to the BBIC 5. In addition, the RFIC 4 may perform signal processing on a transmission signal that is input from the BBIC 5 by, for example, up-converting the transmission signal, and may output a radio-frequency signal (herein, radio-frequency transmission signal) generated by the signal processing to a transmission-side signal path.

In addition, in this embodiment, the RFIC 4 may have a function of a control unit that controls, on the basis of the frequency band (band) to be used, connection of a switch (described later) included in the radio-frequency front-end circuit 50. Specifically, by using a control signal (not illustrated), the RFIC 4 switches connection of a switch included in the radio-frequency front-end circuit 50. Note that the control unit may be provided outside the RFIC 4 and may be provided in, for example, the radio-frequency front-end circuit 50 or the BBIC 5.

Next, a detailed configuration of the radio-frequency front-end circuit 50 will be described.

As illustrated in FIG. 1A, the radio-frequency front-end circuit 50 is a front-end circuit for reception and includes a multiplexer 10, a switch 31, filters 21, 22, and 23, and reception amplifiers 41, 42, and 43.

The multiplexer 10 is a diplexer including a common terminal 100, input/output terminals 110 and 120, a low-pass filter 11, and a high-pass filter 12. Note that the multiplexer according to the present disclosure includes, not only a diplexer that demultiplexes or multiplexes two frequency band groups as in this embodiment, but also a multiplexer that demultiplexes or multiplexes three or more frequency band groups.

The low-pass filter 11 is arranged between the common terminal 100 and the input/output terminal 110. The low-pass filter 11 is a low-pass filter whose pass band is frequencies in a low band group and whose attenuation band is frequencies in a high band group. The low-pass filter 11 includes a first frequency-variable circuit including a first switching element. In accordance with connection or disconnection of the first switching element, at least one of the pass band and the attenuation band of the low-pass filter 11 is changeable.

The high-pass filter 12 is arranged between the common terminal 100 and the input/output terminal 120. The high-pass filter 12 is a high-pass filter whose pass band is the frequencies in the high band group and whose attenuation band is the frequencies in the low band group.

Note that in this embodiment, a frequency-variable filter including the first switching element is defined as a first filter, and a frequency-invariable filter is defined as a second filter. In addition, an input/output terminal connected to the first filter is defined as a first input/output terminal, and an input/output terminal connected to the second filter is defined as a second input/output terminal. The pass band of the first filter is switched between a first frequency band and a second frequency band in accordance with connection or disconnection of the first switching element. The pass band of the second filter is a third frequency band. The first frequency band and the second frequency band belong to a first frequency band group, and the third frequency band belongs to a second frequency band group.

Therefore, in the multiplexer 10 illustrated in FIG. 1A, the low-pass filter 11 is the first filter, the high-pass filter 12 is the second filter, the input/output terminal 110 is the first input/output terminal, and the input/output terminal 120 is the second input/output terminal. In addition, the low band group is the first frequency band group, and the high band group is the second frequency band group.

The switch 31 is a third switching element including a common terminal 310 (second common terminal), a selection terminal 311 (first selection terminal), and a selection terminal 312 (second selection terminal), in which the common terminal 310 is connected to the input/output terminal 110. The switch 31 is a single pole double throw (SPDT) switching circuit that can connect the common terminal 310 and any of the selection terminals 311 and 312. Note that the switch 31 may have a circuit configuration in which two single pole single throw (SPST) switches are arranged in parallel. Also, the switch 31 may be, for example, a SP3T or SPOT switching circuit, in which case, a common terminal and necessary selection terminals are used.

The filter 21 is a band-pass filter that is connected to the selection terminal 311 and whose pass band is Band A. The filter 22 is a band-pass filter that is connected to the selection terminal 312 and whose pass band is Band B. The filter 23 is a band-pass filter that is connected to the input/output terminal 120 and whose pass band is Band C.

In the radio-frequency front-end circuit 50 illustrated in FIG. 1A, the filter 21 is a third filter whose pass band is a first frequency band (Band A), the filter 22 is a fourth filter whose pass band is a second frequency band (Band B), and the filter 23 is a fifth filter whose pass band is a third frequency band (Band C).

The reception amplifier 41 is connected to the filter 21, the reception amplifier 42 is connected to the filter 22, and the reception amplifier 43 is connected to the filter 23. Each of the reception amplifiers 41 to 43 is, for example, a low-noise amplifier constituted by a transistor and the like. The reception amplifiers 41 and 42 constitute an amplifier circuit 40 (first amplifier circuit). The reception amplifier 43 is a second amplifier circuit. Note that the amplifier circuit 40 may be constituted by a single reception amplifier, in which case an SPDT switch is arranged between the filter 21 and the amplifier circuit 40 and between the filter 22 and the amplifier circuit 40.

Figure 1B:
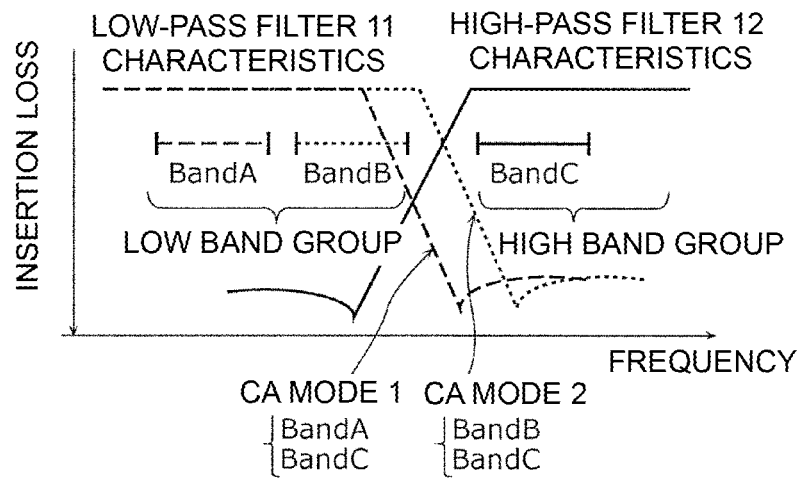
FIG. 1B illustrates a relationship between bandpass characteristics and CA mode of the multiplexer according to the first embodiment.

FIG. 1B illustrates a relationship between bandpass characteristics and CA mode of the multiplexer 10 according to the first embodiment. In this drawing, for example, frequency allocation of Band A, Band B, and Band C in the ascending order of the frequencies is illustrated. In addition, in this drawing, the bandpass characteristics of the frequency-variable low-pass filter 11 and the bandpass characteristics of the frequency-invariable high-pass filter 12 are illustrated.

Note that Band A (first frequency band) and Band B (second frequency band) may partly overlap with each other. That is, at least part of Band B (second frequency band) is located between Band A (first frequency band) and Band C (third frequency band).

For example, in the band arrangement illustrated in FIG. 1B, Band A may be set as the first frequency band, and Band E (Band A+Band B) including Band A and Band B may be set as the second frequency band.

The multiplexer 10 and the radio-frequency front-end circuit 50 may concurrently send a radio-frequency signal in one of Band A and Band B that belong to the low band group and a radio-frequency signal in Band C that belongs to the high band group. Specifically, it is possible to execute CA mode 1 using Band A and Band C and CA mode 2 using Band B and Band C. Furthermore, a radio-frequency signal in Band A and a radio-frequency signal in Band B are sent exclusively.

In this embodiment, the frequencies in the low band group are lower than those in the high band group. Note that some frequencies in the low band group may overlap with frequencies in the high band group. In this case, the frequencies in the low band group being lower than those in the high band group are defined as follows: the center frequency of the frequencies in the low band group is lower than the center frequency of the frequencies in the high band group.

As illustrated in FIG. 1B, for example, (1) in CA mode 1 in which Band A and Band C are concurrently used and (2) in CA mode 2 in which Band B and Band C are concurrently used, the frequency interval between two concurrently used frequency bands differs. In this example, the frequency interval in CA mode 1 is larger than the frequency interval in CA mode 2.

According to the above configuration of the multiplexer 10, in accordance with one of connection and disconnection of the first switching element, as illustrated in FIG. 1B, at least one of the pass band and the attenuation band of the low-pass filter 11 is changeable. Thus, for example, (1) in a case of CA mode 2 in which the frequency interval between two concurrently used frequency bands is small, the pass band of the low-pass filter 11 is made closer to the pass band of the high-pass filter 12. This can suppress increase in insertion loss on the pass band side of the high-pass filter 12 in the pass band of the low-pass filter 11 (at the higher end of the pass band of the low-pass filter 11). In other words, it is possible to suppress increase in insertion loss at the higher end of the pass band of the filter 22 connected in the following stage of the low-pass filter 11.

In addition, according to the above configuration of the multiplexer 10, in accordance with the other of connection and disconnection of the first switching element, as illustrated in FIG. 1B, for example, (2) in a case of CA mode 1 in which the frequency interval between two concurrently used frequency bands is large, the attenuation band of the low-pass filter 11, located between the pass band of the low-pass filter 11 and the pass band of the high-pass filter 12, is made closer to the pass band side of the low-pass filter 11 (low-frequency side). This can increase the isolation between the low-pass filter 11 and the high-pass filter 12.

Accordingly, even if the frequency band to be selected is changed in the multiplexer 10 executing CA between the so-called low band group and the high band group, it is possible to suppress increase in insertion loss or degradation of demultiplexing characteristics.

Note that in this embodiment, a frequency-variable filter including the first switching element may be the high-pass filter 12 instead of the low-pass filter 11.

In addition, although this embodiment has illustrated the radio-frequency front-end circuit 50 for reception, the radio-frequency front-end circuit may be a radio-frequency front-end circuit for transmission or may execute both transmission and reception.

Now, Examples 1 to 5 and Modifications 1 to 4 will illustrate specific circuit configuration examples of the multiplexer according to the first embodiment.

[1.2 Multiplexer According to Example 1]

Figure 2A:
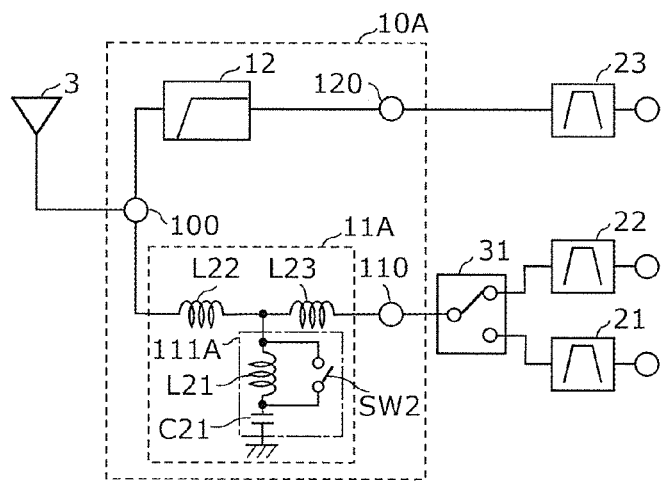
FIG. 2A illustrates a circuit configuration of a multiplexer according to Example 1 and peripheral circuits thereof.

FIG. 2A illustrates a circuit configuration of a multiplexer 10A according to Example 1 and peripheral circuits thereof.

In the drawing, the multiplexer 10A according to Example 1, the antenna element 3, the switch 31, and the filters 21 to 23 are illustrated.

The multiplexer 10A according to Example 1 is an example of a specific circuit configuration of the multiplexer 10 according to the first embodiment and includes a low-pass filter 11A and the high-pass filter 12. The multiplexer 10A according to Example 1 is different from the multiplexer 10 according to the first embodiment only in the circuit configuration of the low-pass filter 11A. Hereinafter, the same configuration of the multiplexer 10A according to Example 1 as that of the multiplexer 10 according to the first embodiment will be omitted from the following description, and a different configuration will mainly be described.

The low-pass filter 11A includes inductors L22 and L23 and a parallel-arm circuit 111A.

The inductors L22 and L23 are connected in series to each other on a path connecting the common terminal 100 and the input/output terminal 110. Each of the inductors L22 and L23 forms a series-arm circuit arranged on a path connecting the common terminal 100 and the input/output terminal 110.

The parallel-arm circuit 111A is a first frequency-variable circuit connected between a connection node of the inductors L22 and L23 and ground and including an inductor L21, a capacitor C21, and a switch SW2.

The inductor L21 and the capacitor C21 are connected in series between the connection node of the inductors L22 and L23 and ground. In addition, the switch SW2 is the first switching element connected in parallel to the inductor L21. The switch SW2 is, for example, a single pole single throw (SPST) switching circuit.

In this Example, the low-pass filter 11A is the first filter, the high-pass filter 12 is the second filter, the input/output terminal 110 is the first input/output terminal, and the input/output terminal 120 is the second input/output terminal. In addition, the low band group is the first frequency band group, and the high band group is the second frequency band group.

Figure 2B:
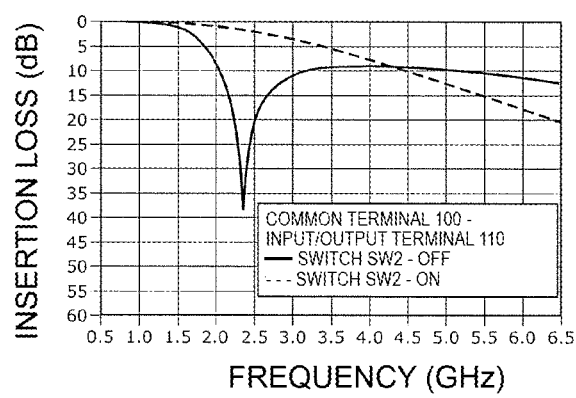
FIG. 2B is a graph illustrating bandpass characteristics of a low-pass filter in the multiplexer according to Example 1.

FIG. 2B is a graph illustrating bandpass characteristics of the low-pass filter 11A in the multiplexer 10A according to Example 1. As illustrated in the graph, by connecting (On) the switch SW2, the inductor L21 that is connected in parallel to the switch SW2 is by-passed. Thus, since the parallel-arm circuit 111A no longer has a resonance point, an attenuation pole disappears (broken line in FIG. 2B). On the other hand, by disconnecting (Off) the switch SW2, the parallel-arm circuit 111A becomes an LC series resonance circuit and has a resonance point, and thus, the attenuation pole appears. This increases the sharpness on the high-frequency side of the pass band of the low-pass filter 11A (solid line in FIG. 2B). Thus, the attenuation amount of the attenuation band of the low-pass filter 11A corresponding to the pass band of the high-pass filter 12 is increased. That is, the isolation between the low-pass filter 11A and the high-pass filter 12 is increased.

If the multiplexer 10A according to Example 1 is applied to frequency allocation illustrated in FIG. 1B, for example, in a case of CA mode 2, by connecting the switch SW2, the insertion loss at the higher end of Band B can be reduced. On the other hand, in a case of CA mode 1, by disconnecting the switch SW2, the isolation between Band A and Band C can be increased.

Accordingly, even if the frequency band to be selected is changed in the multiplexer 10A executing CA between the so-called low band group and the high band group, it is possible to suppress increase in insertion loss or degradation of demultiplexing characteristics.

[1.3 Multiplexer According to Example 2]

Figure 3A:
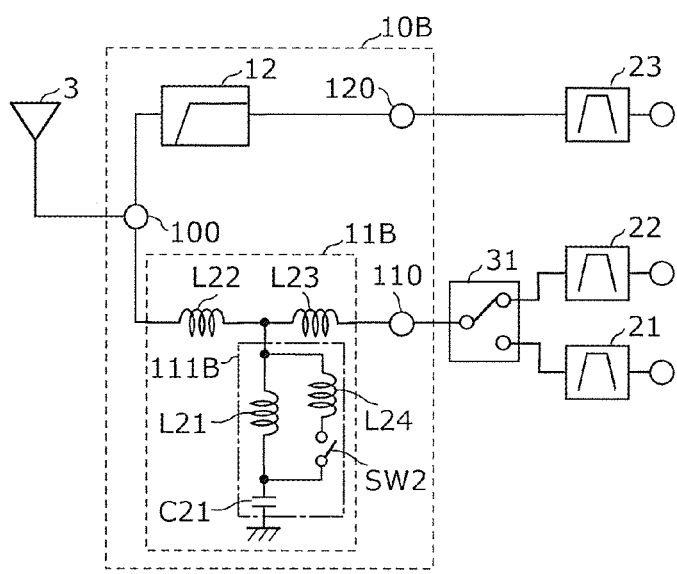
FIG. 3A illustrates a circuit configuration of a multiplexer according to Example 2 and peripheral circuits thereof.

FIG. 3A illustrates a circuit configuration of a multiplexer 10B according to Example 2 and peripheral circuits thereof. In the drawing, the multiplexer 10B according to Example 2, the antenna element 3, the switch 31, and the filters 21 to 23 are illustrated.

The multiplexer 10B according to Example 2 is an example of a specific circuit configuration of the multiplexer 10 according to the first embodiment and includes a low-pass filter 11B and the high-pass filter 12. The multiplexer 10B according to Example 2 is different from the multiplexer 10A according to Example 1 only in the configuration of a parallel-arm circuit 111B. Hereinafter, the same configuration of the multiplexer 10B according to Example 2 as that of the multiplexer 10A according to Example 1 will be omitted from the following description, and a different configuration will mainly be described.

The low-pass filter 11B includes the inductors L22 and L23 and the parallel-arm circuit 111B.

The parallel-arm circuit 111B is a first frequency-variable circuit connected between a connection node of the inductors L22 and L23 and ground and including the inductor L21, an inductor L24, the capacitor C21, and the switch SW2.

The inductor L21 and the capacitor C21 are connected in series between the connection node of the inductors L22 and L23 and ground. In addition, a circuit in which the switch SW2 and the inductor L24 are connected in series is connected in parallel to the inductor L21.

In this Example, the low-pass filter 11B is the first filter, the high-pass filter 12 is the second filter, the input/output terminal 110 is the first input/output terminal, and the input/output terminal 120 is the second input/output terminal. In addition, the low band group is the first frequency band group, and the high band group is the second frequency band group.

Figure 3B:
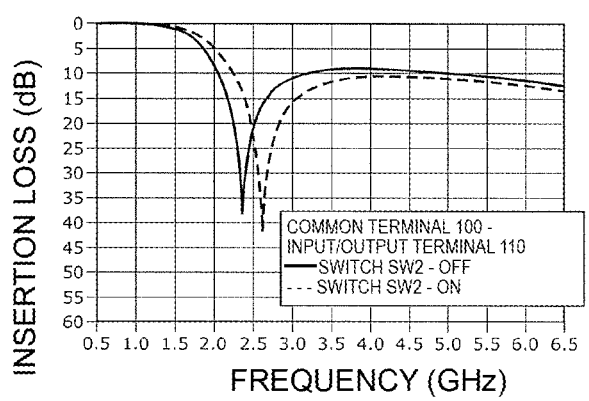
FIG. 3B is a graph illustrating bandpass characteristics of a low-pass filter in the multiplexer according to Example 2.

FIG. 3B is a graph illustrating bandpass characteristics of the low-pass filter 11B in the multiplexer 10B according to Example 2. As illustrated in the graph, since the inductor L24 is connected in series to the switch SW2, even if the switch SW2 is connected (On), the parallel-arm circuit 111B becomes an LC series resonance circuit of a parallel composite inductor of the inductors L21 and L24 and the capacitor C21 and has a resonance point, and thus, an attenuation pole appears (broken line in FIG. 3B). On the other hand, by disconnecting (Off) the switch SW2, the parallel-arm circuit 111B becomes an LC series resonance circuit of the inductor L21 and the capacitor C21 and has a resonance point on a lower frequency side than the resonance point during connection of the switch SW2, and thus, an attenuation pole appears on a lower frequency side than that during connection of the switch SW2. This increases the sharpness on the high-frequency side of the pass band of the low-pass filter 11B (solid line in FIG. 3B). Thus, the isolation between the low-pass filter 11B and the high-pass filter 12 is increased.

If the multiplexer 10B according to Example 2 is applied to frequency allocation illustrated in FIG. 1B, for example, in a case of CA mode 2, by connecting the switch SW2, the insertion loss at the higher end of Band B can be reduced. On the other hand, in a case of CA mode 1, by disconnecting the switch SW2, the isolation between Band A and Band C can be increased.

Accordingly, even if the frequency band to be selected is changed in the multiplexer 10B executing CA between the so-called low band group and the high band group, it is possible to suppress increase in insertion loss or degradation of demultiplexing characteristics.

[1.4 Multiplexer According to Example 3]

Figure 4A:
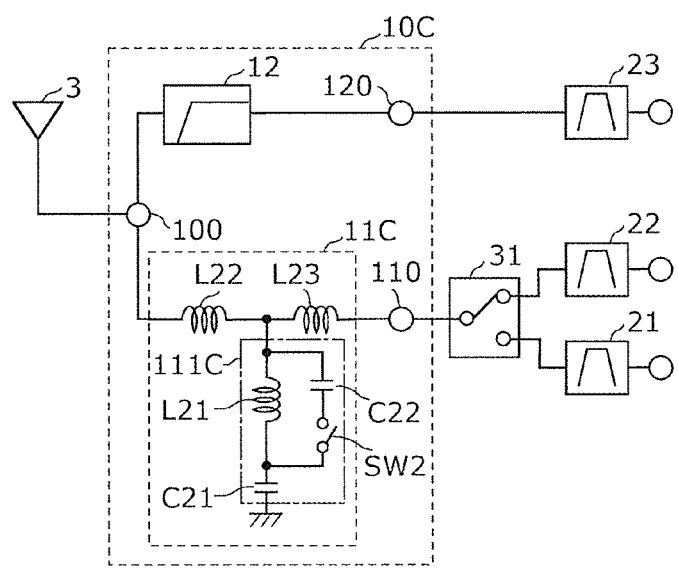
FIG. 4A illustrates a circuit configuration of a multiplexer according to Example 3 and peripheral circuits thereof.

FIG. 4A illustrates a circuit configuration of a multiplexer 10C according to Example 3 and peripheral circuits thereof. In the drawing, the multiplexer 10C according to Example 3, the antenna element 3, the switch 31, and the filters 21 to 23 are illustrated.

The multiplexer 10C according to Example 3 is an example of a specific circuit configuration of the multiplexer 10 according to the first embodiment and includes a low-pass filter 11C and the high-pass filter 12. The multiplexer 10C according to Example 3 is different from the multiplexer 10B according to Example 2 only in the configuration of a parallel-arm circuit 111C. Hereinafter, the same configuration of the multiplexer 10C according to Example 3 as that of the multiplexer 10B according to Example 2 will be omitted from the following description, and a different configuration will mainly be described.

The low-pass filter 11C includes the inductors L22 and L23 and the parallel-arm circuit 111C.

The parallel-arm circuit 111C is a first frequency-variable circuit connected between a connection node of the inductors L22 and L23 and ground and including the inductor L21, the capacitor C21, a capacitor C22, and the switch SW2.

The inductor L21 and the capacitor C21 are connected in series between the connection node of the inductors L22 and L23 and ground. In addition, a circuit in which the switch SW2 and the capacitor C22 are connected in series is connected in parallel to the inductor L21.

In this Example, the low-pass filter 11C is the first filter, the high-pass filter 12 is the second filter, the input/output terminal 110 is the first input/output terminal, and the input/output terminal 120 is the second input/output terminal. In addition, the low band group is the first frequency band group, and the high band group is the second frequency band group.

Figure 4B:
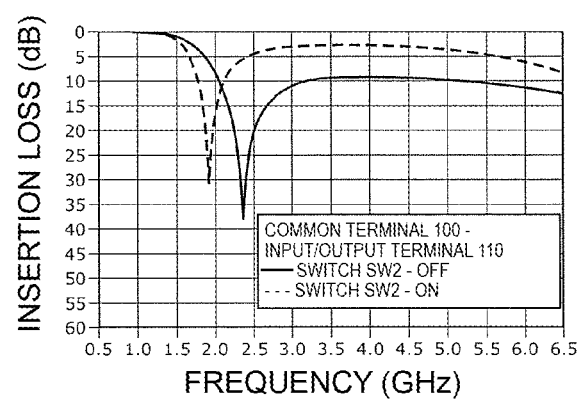
FIG. 4B is a graph illustrating bandpass characteristics of a low-pass filter in the multiplexer according to Example 3.

FIG. 4B is a graph illustrating bandpass characteristics of the low-pass filter 11C in the multiplexer 10C according to Example 3. As illustrated in the graph, since the capacitor C22 is connected in series to the switch SW2, even if the switch SW2 is connected (On), the parallel-arm circuit 111C becomes a series resonance circuit of a parallel composite circuit of the inductor L21 and the capacitor C22 and the capacitor C21 and has a resonance point, and thus, an attenuation pole appears (broken line in FIG. 4B). On the other hand, by disconnecting (Off) the switch SW2, the parallel-arm circuit 111C becomes an LC series resonance circuit of the inductor L21 and the capacitor C21 and has a resonance point on a higher frequency side than the resonance point during connection of the switch SW2, and thus, an attenuation pole appears on a higher frequency side than that during connection of the switch SW2. This reduces the insertion loss on the high-frequency side of the pass band of the low-pass filter 11C (solid line in FIG. 4B).

If the multiplexer 10C according to Example 3 is applied to frequency allocation illustrated in FIG. 1B, for example, in a case of CA mode 2, by disconnecting the switch SW2, the insertion loss at the higher end of Band B can be reduced. On the other hand, in a case of CA mode 1, by connecting the switch SW2, the isolation between Band A and Band C can be increased.

Accordingly, even if the frequency band to be selected is changed in the multiplexer 10C executing CA between the so-called low band group and the high band group, it is possible to suppress increase in insertion loss or degradation of demultiplexing characteristics.

[1.5 Multiplexer According to Example 4]

Figure 5A:
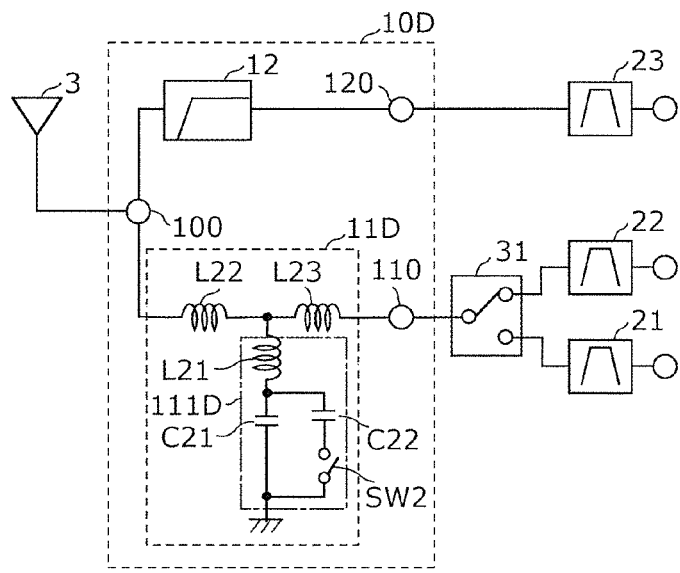
FIG. 5A illustrates a circuit configuration of a multiplexer according to Example 4 and peripheral circuits thereof.

FIG. 5A illustrates a circuit configuration of a multiplexer 10D according to Example 4 and peripheral circuits thereof. In the drawing, the multiplexer 10D according to Example 4, the antenna element 3, the switch 31, and the filters 21 to 23 are illustrated.

The multiplexer 10D according to Example 4 is an example of a specific circuit configuration of the multiplexer 10 according to the first embodiment and includes a low-pass filter 11D and the high-pass filter 12. The multiplexer 10D according to Example 4 is different from the multiplexer 10B according to Example 2 only in the configuration of a parallel-arm circuit 111D. Hereinafter, the same configuration of the multiplexer 10D according to Example 4 as that of the multiplexer 10B according to Example 2 will be omitted from the following description, and a different configuration will mainly be described.

The low-pass filter 11D includes the inductors L22 and L23 and the parallel-arm circuit 111D.

The parallel-arm circuit 111D is a first frequency-variable circuit connected between a connection node of the inductors L22 and L23 and ground and including the inductor L21, the capacitor C21, the capacitor C22, and the switch SW2.

The inductor L21 and the capacitor C21 are connected in series between the connection node of the inductors L22 and L23 and ground. In addition, a circuit in which the switch SW2 and the capacitor C22 are connected in series is connected in parallel to the capacitor C21.

In this Example, the low-pass filter 11D is the first filter, the high-pass filter 12 is the second filter, the input/output terminal 110 is the first input/output terminal, and the input/output terminal 120 is the second input/output terminal. In addition, the low band group is the first frequency band group, and the high band group is the second frequency band group.

Figure 5B:
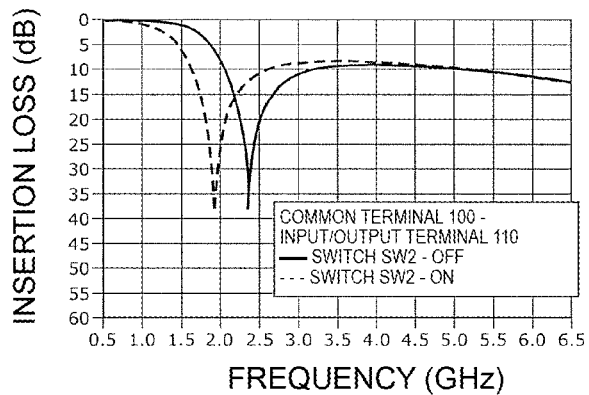
FIG. 5B is a graph illustrating bandpass characteristics of a low-pass filter in the multiplexer according to Example 4.

FIG. 5B is a graph illustrating bandpass characteristics of the low-pass filter 11D in the multiplexer 10D according to Example 4. As illustrated in the graph, since the capacitor C22 is connected in series to the switch SW2, even if the switch SW2 is connected (On), the parallel-arm circuit 111D becomes an LC series resonance circuit of a parallel composite capacitor of the capacitors C21 and C22 and the inductor L2 and has a resonance point, and thus, an attenuation pole appears (broken line in FIG. 5B). On the other hand, by disconnecting (Off) the switch SW2, the parallel-arm circuit 111D becomes an LC series resonance circuit of the inductor L21 and the capacitor C21 and has a resonance point on a higher frequency side than the resonance point during connection of the switch SW2, and thus, an attenuation pole appears on a higher frequency side than that during connection of the switch SW2. This reduces the insertion loss on the high-frequency side of the pass band of the low-pass filter 11D (solid line in FIG. 5B).

If the multiplexer 10D according to Example 4 is applied to frequency allocation illustrated in FIG. 1B, for example, in a case of CA mode 2, by disconnecting the switch SW2, the insertion loss at the higher end of Band B can be reduced. On the other hand, in a case of CA mode 1, by connecting the switch SW2, the isolation between Band A and Band C can be increased.

Accordingly, even if the frequency band to be selected is changed in the multiplexer 10D executing CA between the so-called low band group and the high band group, it is possible to suppress increase in insertion loss or degradation of demultiplexing characteristics.

Note that in the circuit configuration of the multiplexer 10D according to Example 4, the capacitor C22 connected in series to the switch SW2 may be an inductor. In this case, the frequency shift of the attenuation pole is reversed between connection and disconnection of the switch SW2. Thus, if this configuration is applied to frequency allocation illustrated in FIG. 1B, in a case of CA mode 2, by connecting the switch SW2, the insertion loss at the higher end of Band B can be reduced. On the other hand, in a case of CA mode 1, by disconnecting the switch SW2, the isolation between Band A and Band C can be increased.

Figure 5C:
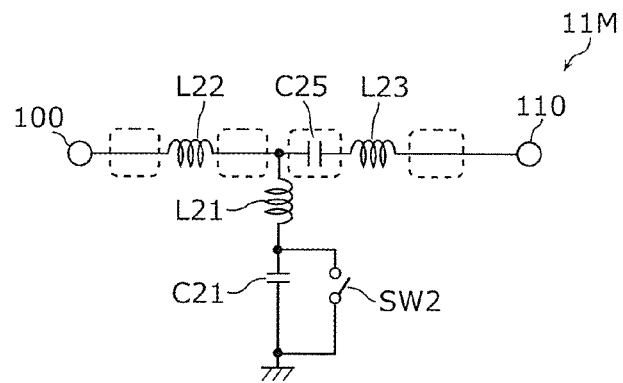

FIG. 5C illustrates a circuit configuration of a low-pass filter 11M according to Example 4a. The low-pass filter 11M illustrated in the drawing is applied to, for example, the low-pass filter included in the multiplexer 10D instead of the low-pass filter 11D according to Example 4. The low-pass filter 11M according to Example 4a is different from the low-pass filter 11D according to Example 4 in that a capacitor C25 is added to the series-arm circuit and that the capacitor C22 is omitted from the parallel-arm circuit. Hereinafter, the same configuration of the low-pass filter 11M according to Example 4a as that of the low-pass filter 11D according to Example 4 will be omitted from the following description, and a different configuration will mainly be described.

The parallel-arm circuit in the low-pass filter 11M is a first frequency-variable circuit connected between a connection node of the inductor L22 and the capacitor C25 and ground and including the inductor L21, the capacitor C21, and the switch SW2.

The inductor L21 and the capacitor C21 are connected in series between the connection node and ground. In addition, the switch SW2 and the capacitor C21 are connected in parallel.

The capacitor C25 is connected in series between the connection node and the inductor L23.

By connecting (On) the switch SW2, the capacitor C21 that is connected in parallel to the switch SW2 is by-passed. Thus, since the parallel-arm circuit no longer has a resonance point, an attenuation pole disappears. On the other hand, by disconnecting (Off) the switch SW2, the parallel-arm circuit becomes an LC series resonance circuit and has a resonance point, and thus, the attenuation pole appears. This increases the sharpness on the high-frequency side of the pass band of the low-pass filter 11M. Thus, the attenuation amount of the attenuation band corresponding to the pass band of the high-pass filter 12 is increased. That is, the isolation between the low-pass filter 11M and the high-pass filter 12 is increased.

Note that the capacitor C25 is not necessarily arranged between the connection node and the inductor L23 and may also be arranged between the connection node and the inductor L22, between the common terminal 100 and the inductor L22, or between the input/output terminal 110 and the inductor L23.

In addition, since the capacitor C25 is arranged in a series arm, the low-pass filter 11M may function as a bandpass filter.

Figure 5D:
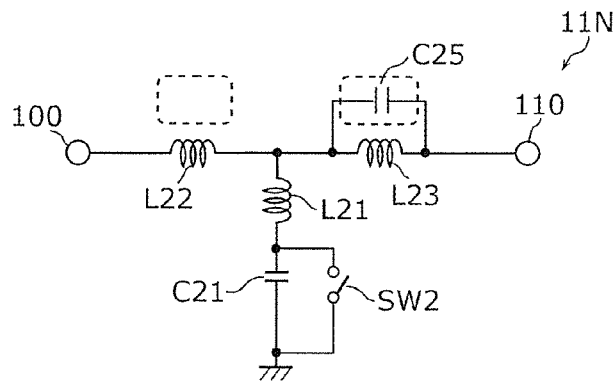
FIG. 5D illustrates a circuit configuration of a low-pass filter according to Example 4b.

FIG. 5D illustrates a circuit configuration of a low-pass filter 11N according to Example 4b. The low-pass filter 11N illustrated in the drawing is applied to, for example, the low-pass filter included in the multiplexer 10D instead of the low-pass filter 11D according to Example 4. The low-pass filter 11N according to Example 4b is different from the low-pass filter 11D according to Example 4 in that a capacitor C25 is added to the series-arm circuit and that the capacitor C22 is omitted from the parallel-arm circuit. Hereinafter, the same configuration of the low-pass filter 11N according to Example 4b as that of the low-pass filter 11D according to Example 4 will be omitted from the following description, and a different configuration will mainly be described.

The parallel-arm circuit in the low-pass filter 11N is a first frequency-variable circuit connected between a connection node of the inductor L22 and the capacitor C25 and ground and including the inductor L21, the capacitor C21, and the switch SW2.

The inductor L21 and the capacitor C21 are connected in series between the connection node and ground. In addition, the switch SW2 and the capacitor C21 are connected in parallel.

The capacitor C25 is connected in parallel to the inductor L23.

By connecting (On) the switch SW2, the capacitor C21 that is connected in parallel to the switch SW2 is by-passed. Thus, since the parallel-arm circuit no longer has a resonance point, an attenuation pole disappears. On the other hand, by disconnecting (Off) the switch SW2, the parallel-arm circuit becomes an LC series resonance circuit and has a resonance point, and thus, the attenuation pole appears. This increases the sharpness on the high-frequency side of the pass band of the low-pass filter 11N. Thus, the attenuation amount of the attenuation band corresponding to the pass band of the high-pass filter 12 is increased. That is, the isolation between the low-pass filter 11N and the high-pass filter 12 is increased.

Note that the capacitor C25 is not necessarily connected in parallel to the inductor L23 and may also be connected in parallel to the inductor L22.

Figure 5E:
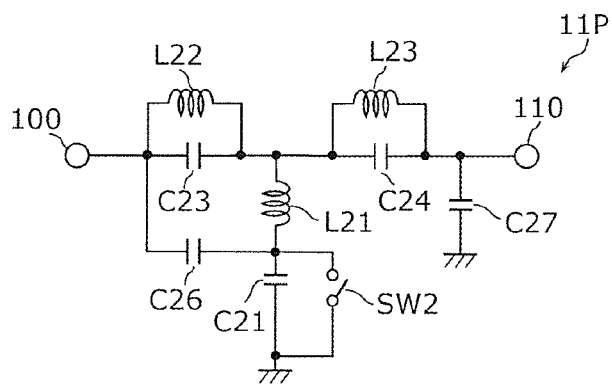
FIG. 5E illustrates a circuit configuration of a low-pass filter according to Example 4c.

FIG. 5E illustrates a circuit configuration of a low-pass filter 11P according to Example 4c. The low-pass filter 11P illustrated in the drawing is applied to, for example, the low-pass filter included in the multiplexer 10D instead of the low-pass filter 11D according to Example 4. The low-pass filter 11P according to Example 4c is different from the low-pass filter 11D according to Example 4 in that capacitors C23, C24, and C27 are added to the series-arm circuit, that the capacitor C22 is omitted from the parallel-arm circuit, and that a capacitor C26 connected to the series-arm circuit and the parallel-arm circuit is added. Hereinafter, the same configuration of the low-pass filter 11P according to Example 4c as that of the low-pass filter 11D according to Example 4 will be omitted from the following description, and a different configuration will mainly be described.

The parallel-arm circuit in the low-pass filter 11P is a first frequency-variable circuit connected between a connection node of the inductors L22 and L23 and ground and including the inductor L21, the capacitor C21, and the switch SW2.

The inductor L21 and the capacitor C21 are connected in series between the connection node and ground. In addition, the switch SW2 and the capacitor C21 are connected in parallel.

The capacitor C23 is connected in parallel to the inductor L22. The capacitor C24 is connected in parallel to the inductor L23. The capacitor C27 is connected between the input/output terminal 110 and ground. The capacitor C26 is connected between the common terminal 100 and a connection point of the inductor L21 and the capacitor C21.

By connecting (On) the switch SW2, the capacitor C21 that is connected in parallel to the switch SW2 is by-passed. Thus, since the parallel-arm circuit no longer has a resonance point, an attenuation pole disappears. On the other hand, by disconnecting (Off) the switch SW2, the parallel-arm circuit becomes an LC series resonance circuit and has a resonance point, and thus, the attenuation pole appears. This increases the sharpness on the high-frequency side of the pass band of the low-pass filter 11P. Thus, the attenuation amount of the attenuation band corresponding to the pass band of the high-pass filter 12 is increased. That is, the isolation between the low-pass filter 11P and the high-pass filter 12 is increased.

Note that the capacitor C26 is not necessarily connected between the common terminal 100 and the connection point and may also be connected between any two points among the common terminal 100, the connection node, the connection point, and the input/output terminal 110. In addition, the capacitor C27 is not necessarily connected between the input/output terminal 110 and ground and may be connected between ground and any one of the common terminal 100, the connection node, the connection point, and the input/output terminal 110.

[1.6 Multiplexer According to Example 5]

Figure 6A:
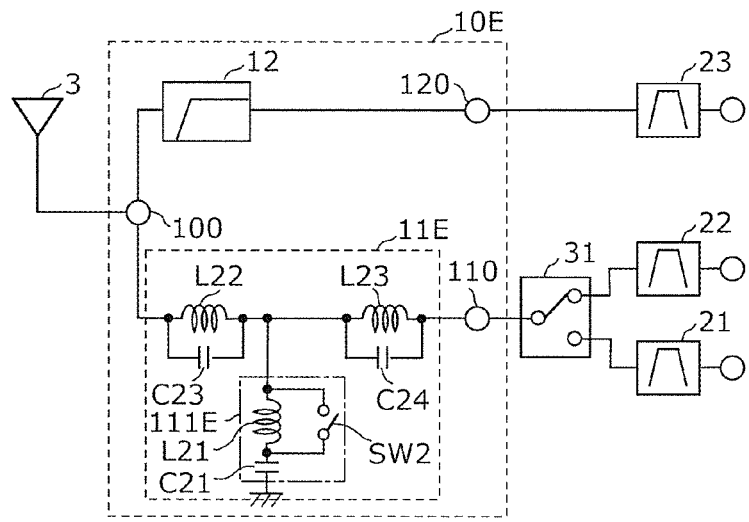
FIG. 6A illustrates a circuit configuration of a multiplexer according to Example 5 and peripheral circuits thereof.

FIG. 6A illustrates a circuit configuration of a multiplexer 10E according to Example 5 and peripheral circuits thereof. In the drawing, the multiplexer 10E according to Example 5, the antenna element 3, the switch 31, and the filters 21 to 23 are illustrated.

The multiplexer 10E according to Example 5 is an example of a specific circuit configuration of the multiplexer 10 according to the first embodiment and includes a low-pass filter 11E and the high-pass filter 12. The multiplexer 10E according to Example 5 is different from the multiplexer 10A according to Example 1 only in the configuration of the series-arm circuit in the low-pass filter 11E. Hereinafter, the same configuration of the multiplexer 10E according to Example 5 as that of the multiplexer 10A according to Example 1 will be omitted from the following description, and a different configuration will mainly be described.

The low-pass filter 11E includes the inductors L22 and L23, the capacitors C23 and C24, and a parallel-arm circuit 111E.

A series-arm circuit in which the inductor L22 and the capacitor C23 are connected in parallel and a series-arm circuit in which the inductor L23 and the capacitor C24 are connected in parallel are connected in series to each other on a path connecting the common terminal 100 and the input/output terminal 110. Each of the two series-arm circuits forms an LC parallel resonance circuit.

The parallel-arm circuit 111E is a first frequency-variable circuit connected between a connection node of the above two series-arm circuits and ground and having the same circuit configuration as the parallel-arm circuit 111A.

In this Example, the low-pass filter 11E is the first filter, the high-pass filter 12 is the second filter, the input/output terminal 110 is the first input/output terminal, and the input/output terminal 120 is the second input/output terminal. In addition, the low band group is the first frequency band group, and the high band group is the second frequency band group.

Figure 6B:
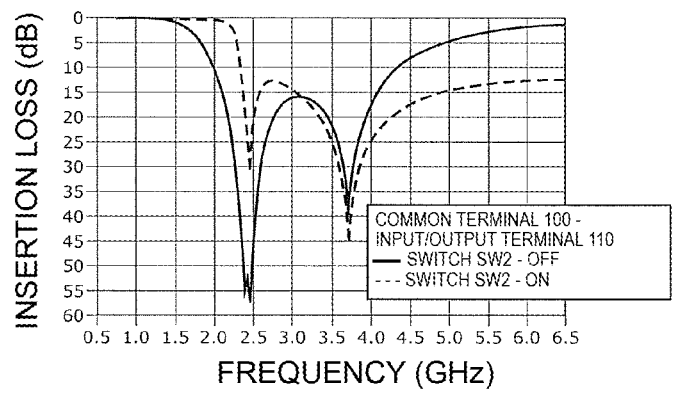
FIG. 6B is a graph illustrating bandpass characteristics of a low-pass filter in the multiplexer according to Example 5.

FIG. 6B is a graph illustrating bandpass characteristics of the low-pass filter 11E in the multiplexer 10E according to Example 5. As illustrated in the graph, by connecting (On) the switch SW2, the inductor L21 that is connected in parallel to the switch SW2 is by-passed. Thus, although the parallel-arm circuit 111E no longer has a resonance point, two attenuation poles appear by LC parallel resonance of the two series-arm circuits (broken line in FIG. 6B). On the other hand, by disconnecting (Off) the switch SW2, the parallel-arm circuit 111E becomes an LC series resonance circuit and has a resonance point, and thus, three attenuation poles appear. This increases the attenuation amount on the high-frequency side of the pass band of the low-pass filter 11E (solid line in FIG. 6B). Thus, the attenuation amount of the attenuation band of the low-pass filter 11E corresponding to the pass band of the high-pass filter 12 is increased. That is, the isolation between the low-pass filter 11E and the high-pass filter 12 is increased.

If the multiplexer 10E according to Example 5 is applied to frequency allocation illustrated in FIG. 1B, for example, in a case of CA mode 2, by connecting the switch SW2, the insertion loss at the higher end of Band B can be reduced. On the other hand, in a case of CA mode 1, by connecting the switch SW2, the isolation between Band A and Band C can be increased.

Accordingly, even if the frequency band to be selected is changed in the multiplexer 10E executing CA between the so-called low band group and the high band group, it is possible to suppress increase in insertion loss or degradation of isolation.

[1.7 Multiplexer According to Modification 1]

Figure 7A:
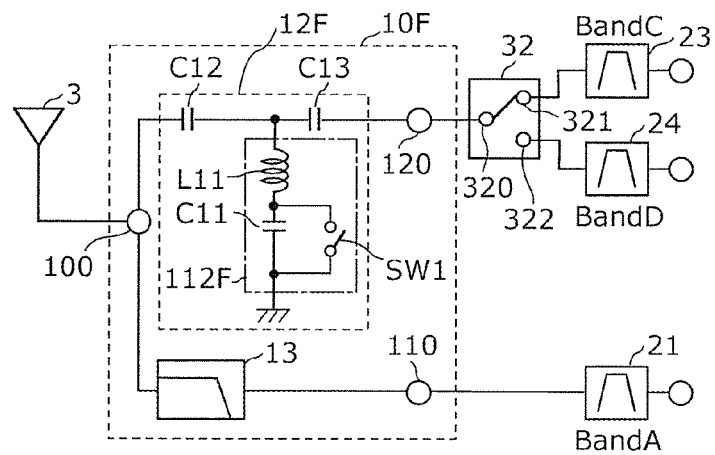
FIG. 7A illustrates a circuit configuration of a multiplexer according to Modification 1 and peripheral circuits thereof.

FIG. 7A illustrates a circuit configuration of a multiplexer 10F according to Modification 1 and peripheral circuits thereof. In the drawing, the multiplexer 10F according to Modification 1, the antenna element 3, a switch 32, the filters 21 and 23, and a filter 24 are illustrated.

The multiplexer 10F according to Modification 1 is a modification of a specific circuit configuration of the multiplexer 10 according to the first embodiment and includes a low-pass filter 13 and a high-pass filter 12F. The multiplexer 10F according to Modification 1 is different from the multiplexer 10 according to the first embodiment in that the high-pass filter 12F is a frequency-variable filter, and the low-pass filter 13 is a frequency-invariable filter. Hereinafter, the same configuration of the multiplexer 10F according to Modification 1 as that of the multiplexer 10 according to the first embodiment will be omitted from the following description, and a different configuration will mainly be described.

The high-pass filter 12F is arranged between the common terminal 100 and the input/output terminal 120. The high-pass filter 12F is a high-pass filter whose pass band is frequencies in a high band group and whose attenuation band is frequencies in a low band group. The high-pass filter 12F includes a first frequency-variable circuit including a first switching element. In accordance with connection or disconnection of the first switching element, at least one of the pass band and the attenuation band of the high-pass filter 12F is changeable.

The low-pass filter 13 is arranged between the common terminal 100 and the input/output terminal 110. The low-pass filter 13 is a low-pass filter whose pass band is the frequencies in the low band group and whose attenuation band is the frequencies in the high band group.

Note that in this embodiment, a frequency-variable filter including the first switching element is defined as a first filter, and a frequency-invariable filter is defined as a second filter. In addition, an input/output terminal connected to the first filter is defined as a first input/output terminal, and an input/output terminal connected to the second filter is defined as a second input/output terminal. The pass band of the first filter is switched between a first frequency band and a second frequency band in accordance with connection or disconnection of the first switching element. The pass band of the second filter is a third frequency band. The first frequency band and the second frequency band belong to a first frequency band group, and the third frequency band belongs to a second frequency band group.

Therefore, in the multiplexer 10F according to this Modification illustrated in FIG. 7A, the high-pass filter 12F is the first filter, the low-pass filter 13 is the second filter, the input/output terminal 120 is the first input/output terminal, and the input/output terminal 110 is the second input/output terminal. In addition, the high band group is the first frequency band group, and the low band group is the second frequency band group.

The switch 32 is a third switching element including a common terminal 320 (second common terminal), a selection terminal 321 (first selection terminal), and a selection terminal 322 (second selection terminal), in which the common terminal 320 is connected to the input/output terminal 120. The switch 32 is an SPDT switching circuit that can connect the common terminal 320 and any of the selection terminals 321 and 322.

The filter 23 is a band-pass filter that is connected to the selection terminal 321 and whose pass band is Band C. The filter 24 is a band-pass filter that is connected to the selection terminal 322 and whose pass band is Band D. The filter 21 is a band-pass filter that is connected to the input/output terminal 110 and whose pass band is Band A.

In this Modification, the filter 23 is a fourth filter whose pass band is a second frequency band (Band C), the filter 24 is a third filter whose pass band is a first frequency band (Band D), and the filter 21 is a fifth filter whose pass band is a third frequency band (Band A).

The high-pass filter 12F includes capacitors C12 and C13 and a parallel-arm circuit 112F.

The capacitors C12 and C13 are connected in series to each other on a path connecting the common terminal 100 and the input/output terminal 120. Each of the capacitors C12 and C13 forms a series-arm circuit arranged on a path connecting the common terminal 100 and the input/output terminal 120.

The parallel-arm circuit 112F is a first frequency-variable circuit connected between a connection node of the capacitors C12 and C13 and ground and including an inductor L11, a capacitor C11, and a switch SW1.

The inductor L11 and the capacitor C11 are connected in series between the connection node of the capacitors C12 and C13 and ground. In addition, the switch SW1 is the first switching element connected in parallel to the capacitor C11. The switch SW1 is, for example, an SPST switching circuit.

Figure 7B:
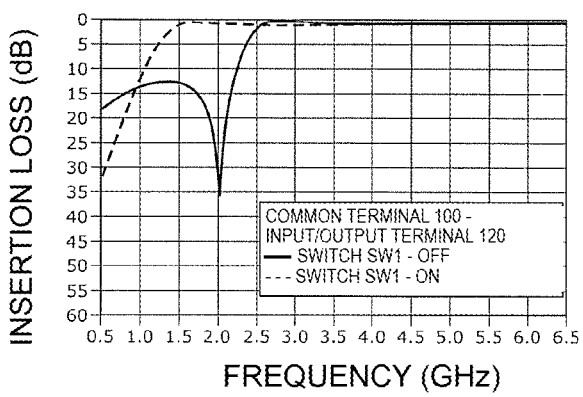
FIG. 7B is a graph illustrating bandpass characteristics of a high-pass filter in the multiplexer according to Modification 1.

FIG. 7B is a graph illustrating bandpass characteristics of the high-pass filter 12F in the multiplexer 10F according to Modification 1. As illustrated in the graph, by connecting (On) the switch SW1, the capacitor C11 that is connected in parallel to the switch SW1 is by-passed. Thus, since the parallel-arm circuit 112F no longer has a resonance point, an attenuation pole disappears (broken line in FIG. 7B). On the other hand, by disconnecting (Off) the switch SW1, the parallel-arm circuit 112F becomes an LC series resonance circuit and has a resonance point, and thus, the attenuation pole appears. This increases the sharpness on the low-frequency side of the pass band of the high-pass filter 12F (solid line in FIG. 7B). Thus, the attenuation amount of the attenuation band corresponding to the pass band of the low-pass filter 13 is increased. That is, the isolation between the high-pass filter 12F and the low-pass filter 13 is increased.

If the multiplexer 10F according to Modification 1 is, for example, applied to frequency allocation of Band A, Band C, and Band D in the ascending order of the frequencies, in a case of CA mode 3 using Band A and Band C, by connecting the switch SW1, the insertion loss at the lower end of Band C can be reduced. On the other hand, in a case of CA mode 4 using Band A and Band D, by disconnecting the switch SW1, the isolation between Band A and Band D can be increased.

Accordingly, even if the frequency band to be selected is changed in the multiplexer 10F executing CA between the so-called low band group and the high band group, it is possible to suppress increase in insertion loss or degradation of the isolation.

Figure 7C:
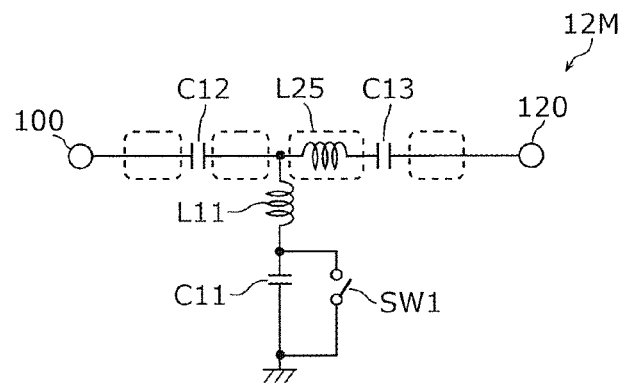

FIG. 7C illustrates a circuit configuration of a high-pass filter 12M according to Modification 1a. The high-pass filter 12M illustrated in the drawing is applied to, for example, the high-pass filter included in the multiplexer 10F instead of the high-pass filter 12F according to Modification 1. The high-pass filter 12M according to Modification 1a is different from the high-pass filter 12F according to Modification 1 in that an inductor L25 is added to the series-arm circuit. Hereinafter, the same configuration of the high-pass filter 12M according to Modification 1a as that of the high-pass filter 12F according to Modification 1 will be omitted from the following description, and a different configuration will mainly be described.

The inductor L25 is arranged in series between the capacitor C12 and the capacitor C13.

By connecting (On) the switch SW1, the capacitor C11 that is connected in parallel to the switch SW1 is by-passed. Thus, since the parallel-arm circuit no longer has a resonance point, an attenuation pole disappears. On the other hand, by disconnecting (Off) the switch SW1, the parallel-arm circuit becomes an LC series resonance circuit and has a resonance point, and thus, the attenuation pole appears. This increases the sharpness on the low-frequency side of the pass band of the high-pass filter 12M. Thus, the attenuation amount of the attenuation band corresponding to the pass band of the low-pass filter 13 is increased. That is, the isolation between the high-pass filter 12M and the low-pass filter 13 is increased.

Note that the inductor L25 is not necessarily arranged between the connection node and the capacitor C13 and may also be arranged between the connection node and the capacitor C12, between the common terminal 100 and the capacitor C12, or between the input/output terminal 120 and the capacitor C13.

In addition, since the inductor L25 is arranged in a series arm, the high-pass filter 12M may function as a bandpass filter.

Figure 7D:
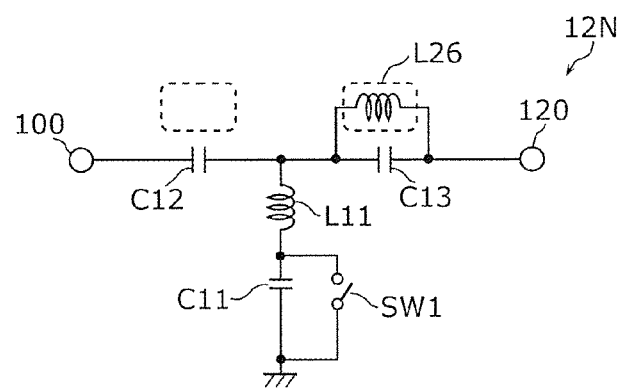
FIG. 7D illustrates a circuit configuration of a high-pass filter according to Modification 1b.

FIG. 7D illustrates a circuit configuration of a high-pass filter 12N according to Modification 1b. The high-pass filter 12N illustrated in the drawing is applied to, for example, the high-pass filter included in the multiplexer 10F instead of the high-pass filter 12F according to Modification 1. The high-pass filter 12N according to Modification 1b is different from the high-pass filter 12F according to Modification 1 in that an inductor L26 is added to the series-arm circuit. Hereinafter, the same configuration of the high-pass filter 12N according to Modification 1b as that of the high-pass filter 12F according to Modification 1 will be omitted from the following description, and a different configuration will mainly be described.

The inductor L26 is connected in parallel to the capacitor C13.

By connecting (On) the switch SW1, the capacitor C11 that is connected in parallel to the switch SW1 is by-passed. Thus, since the parallel-arm circuit no longer has a resonance point, an attenuation pole disappears. On the other hand, by disconnecting (Off) the switch SW1, the parallel-arm circuit becomes an LC series resonance circuit and has a resonance point, and thus, the attenuation pole appears. This increases the sharpness on the low-frequency side of the pass band of the high-pass filter 12N. Thus, the attenuation amount of the attenuation band corresponding to the pass band of the low-pass filter 13 is increased. That is, the isolation between the high-pass filter 12N and the low-pass filter 13 is increased.

Note that the inductor L26 is not necessarily connected in parallel to the capacitor C13 and may also be connected in parallel to the capacitor C12.

Figure 7E:
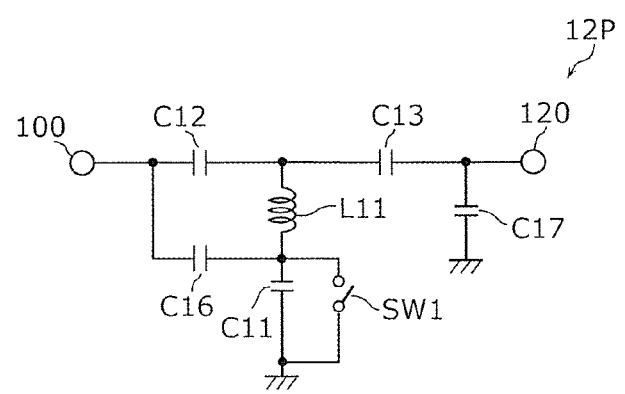
FIG. 7E illustrates a circuit configuration of a high-pass filter according to Modification 1c.

FIG. 7E illustrates a circuit configuration of a high-pass filter 12P according to Modification 1c. The high-pass filter 12P illustrated in the drawing is applied to, for example, the high-pass filter included in the multiplexer 10F instead of the high-pass filter 12F according to Modification 1. The high-pass filter 12P according to Modification 1c is different from the high-pass filter 12F according to Modification 1 in that a capacitor C17 is added to the series-arm circuit and that a capacitor C16 connected to the series-arm circuit and the parallel-arm circuit is added. Hereinafter, the same configuration of the high-pass filter 12P according to Modification 1c as that of the high-pass filter 12F according to Modification 1 will be omitted from the following description, and a different configuration will mainly be described.

The capacitor C17 is connected between the input/output terminal 120 and ground. The capacitor C16 is connected between the common terminal 100 and a connection point of the inductor L11 and the capacitor C11.

By connecting (On) the switch SW1, the capacitor C11 that is connected in parallel to the switch SW1 is by-passed. Thus, since the parallel-arm circuit no longer has a resonance point, an attenuation pole disappears. On the other hand, by disconnecting (Off) the switch SW1, the parallel-arm circuit becomes an LC series resonance circuit and has a resonance point, and thus, the attenuation pole appears. This increases the sharpness on the low-frequency side of the pass band of the high-pass filter 12P. Thus, the attenuation amount of the attenuation band corresponding to the pass band of the low-pass filter 13 is increased. That is, the isolation between the high-pass filter 12P and the low-pass filter 13 is increased.

Note that the capacitor C16 is not necessarily connected between the common terminal 100 and the connection point and may also be connected between any two points among the common terminal 100, the connection node of the capacitors C12 and C13, the connection point, and the input/output terminal 120. In addition, the capacitor C17 is not necessarily connected between the input/output terminal 120 and ground and may be connected between ground and any one of the common terminal 100, the connection node, the connection point, and the input/output terminal 120.

[1.8 Multiplexer According to Modification 2]

Figure 8A:
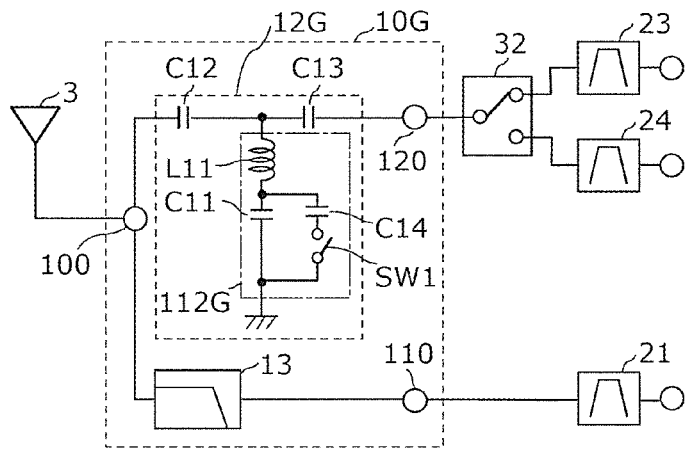
FIG. 8A illustrates a circuit configuration of a multiplexer according to Modification 2 and peripheral circuits thereof.

FIG. 8A illustrates a circuit configuration of a multiplexer 10G according to Modification 2 and peripheral circuits thereof. In the drawing, the multiplexer 10G according to Modification 2, the antenna element 3, the switch 32, the filters 21, 23, and 24 are illustrated.

The multiplexer 10G according to Modification 2 is a modification of a specific circuit configuration of the multiplexer 10 according to the first embodiment and includes a high-pass filter 12G and the low-pass filter 13. The multiplexer 10G according to Modification 2 is different from the multiplexer 10F according to Modification 1 only in the configuration of a parallel-arm circuit 112G. Hereinafter, the same configuration of the multiplexer 10G according to Modification 2 as that of the multiplexer 10F according to Modification 1 will be omitted from the following description, and a different configuration will mainly be described.

The high-pass filter 12G includes the capacitors C12 and C13 and the parallel-arm circuit 112G.

The parallel-arm circuit 112G is a first frequency-variable circuit connected between a connection node of the capacitors C12 and C13 and ground and including the inductor L11, the capacitor C11, a capacitor C14, and the switch SW1.

The inductor L11 and the capacitor C11 are connected in series between the connection node of the capacitors C12 and C13 and ground. In addition, a circuit in which the switch SW1 and the capacitor C14 are connected in series is connected in parallel to the capacitor C11.

In this configuration, the high-pass filter 12G is the first filter, the low-pass filter 13 is the second filter, the input/output terminal 120 is the first input/output terminal, and the input/output terminal 110 is the second input/output terminal. In addition, the high band group is the first frequency band group, and the low band group is the second frequency band group.

Figure 8B:
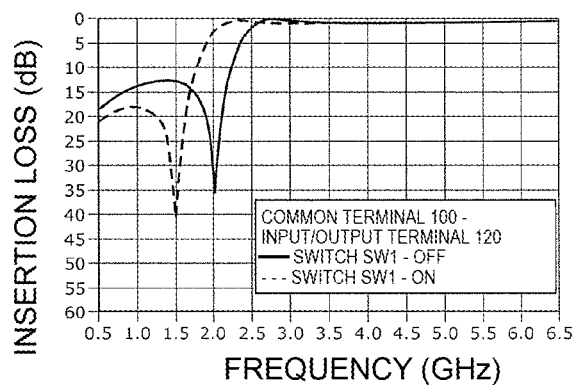
FIG. 8B is a graph illustrating bandpass characteristics of a high-pass filter in the multiplexer according to Modification 2.

FIG. 8B is a graph illustrating bandpass characteristics of the high-pass filter 12G in the multiplexer 10G according to Modification 2. As illustrated in the graph, since the capacitor C14 is connected in series to the switch SW1, even if the switch SW1 is connected (On), the parallel-arm circuit 112G becomes an LC series resonance circuit of a parallel composite capacitor of the capacitors C11 and C14 and the inductor L11 and has a resonance point, and thus, an attenuation pole appears (broken line in FIG. 8B). On the other hand, by disconnecting (Off) the switch SW1, the parallel-arm circuit 112G becomes an LC series resonance circuit of the capacitor C11 and the inductor L11 and has a resonance point on a higher frequency side than the resonance point during connection of the switch SW1, and thus, the attenuation pole appears on a higher frequency side than that during connection of the switch SW1. This increases the sharpness on the low-frequency side of the pass band of the high-pass filter 12G (solid line in FIG. 8B). Thus, the isolation between the high-pass filter 12G and the low-pass filter 13 is increased.

If the multiplexer 10G according to Modification 2 is, for example, applied to frequency allocation of Band A, Band C, and Band D in the ascending order of the frequencies, in a case of CA mode 3 using Band A and Band C, by connecting the switch SW1, the insertion loss at the lower end of Band C can be reduced. On the other hand, in a case of CA mode 4 using Band A and Band D, by disconnecting the switch SW1, the isolation between Band A and Band D can be increased.

Accordingly, even if the frequency band to be selected is changed in the multiplexer 10G executing CA between the so-called low band group and the high band group, it is possible to suppress increase in insertion loss or degradation of demultiplexing characteristics.

Note that in the circuit configuration of the multiplexer 10G according to Modification 2, the capacitor C14 connected in series to the switch SW1 may be an inductor. In this case, the frequency shift of the attenuation pole is reversed between connection and disconnection of the switch SW1. Thus, if this configuration is applied to the above frequency allocation, in a case of CA mode 3, by disconnecting the switch SW1, the insertion loss at the lower end of Band C can be reduced. On the other hand, in a case of CA mode 4, by connecting the switch SW1, the isolation between Band A and Band D can be increased.

[1.9 Multiplexer According to Modification 3]

Figure 9A:
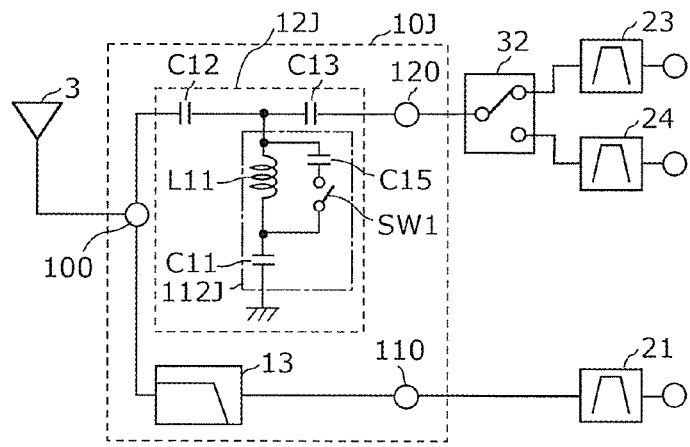
FIG. 9A illustrates a circuit configuration of a multiplexer according to Modification 3 and peripheral circuits thereof.

FIG. 9A illustrates a circuit configuration of a multiplexer 10J according to Modification 3 and peripheral circuits thereof. In the drawing, the multiplexer 10J according to Modification 3, the antenna element 3, the switch 32, and the filters 21, 23, and 24 are illustrated.

The multiplexer 10J according to Modification 3 is a modification of a specific circuit configuration of the multiplexer 10 according to the first embodiment and includes a high-pass filter 12J and the low-pass filter 13. The multiplexer 10J according to Modification 3 is different from the multiplexer 10G according to Modification 2 only in the configuration of a parallel-arm circuit 112J. Hereinafter, the same configuration of the multiplexer 10J according to Modification 3 as that of the multiplexer 10G according to Modification 2 will be omitted from the following description, and a different configuration will mainly be described.

The high-pass filter 12J includes the capacitors C12 and C13 and the parallel-arm circuit 112J.

The parallel-arm circuit 112J is a first frequency-variable circuit connected between a connection node of the capacitors C12 and C13 and ground and including the inductor L11, the capacitor C11, a capacitor C15, and the switch SW1.

The inductor L11 and the capacitor C11 are connected in series between the connection node of the capacitors C12 and C13 and ground. In addition, a circuit in which the switch SW1 and the capacitor C15 are connected in series is connected in parallel to the inductor L11.

In this Modification, the high-pass filter 12J is the first filter, the low-pass filter 13 is the second filter, the input/output terminal 120 is the first input/output terminal, and the input/output terminal 110 is the second input/output terminal. In addition, the high band group is the first frequency band group, and the low band group is the second frequency band group.

Figure 9B:
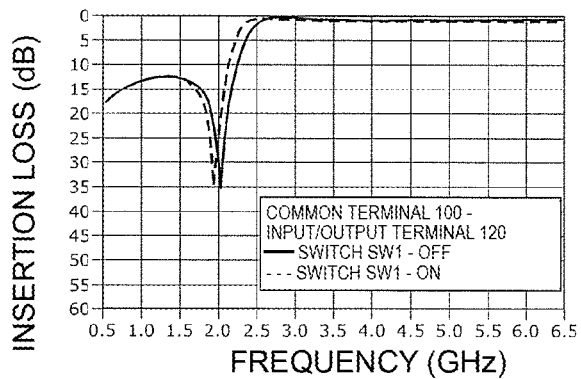
FIG. 9B is a graph illustrating bandpass characteristics of a high-pass filter in the multiplexer according to Modification 3.

FIG. 9B is a graph illustrating bandpass characteristics of the high-pass filter 12J in the multiplexer 10J according to Modification 3. As illustrated in the graph, since the capacitor C15 is connected in series to the switch SW1, even if the switch SW1 is connected (On), the parallel-arm circuit 112J becomes a series resonance circuit of a parallel composite circuit of the inductor L11 and the capacitor C15 and the capacitor C11 and has a resonance point, and thus, an attenuation pole appears (broken line in FIG. 9B). On the other hand, by disconnecting (Off) the switch SW1, the parallel-arm circuit 112J becomes an LC series resonance circuit of the inductor L11 and the capacitor C11 and has a resonance point on a higher frequency side than the resonance point during connection of the switch SW1, and thus, an attenuation pole appears on a higher frequency side than that during connection of the switch SW1 (solid line in FIG. 9B).

If the multiplexer 10J according to Modification 3 is, for example, applied to frequency allocation of Band A, Band C, and Band D in the ascending order of the frequencies, in a case of CA mode 3 using Band A and Band C, by connecting the switch SW1, the insertion loss at the lower end of Band C can be reduced. On the other hand, in a case of CA mode 4 using Band A and Band D, by disconnecting the switch SW1, the isolation between Band A and Band D can be increased.

Accordingly, even if the frequency band to be selected is changed in the multiplexer 10J executing CA between the so-called low band group and the high band group, it is possible to suppress increase in insertion loss or degradation of demultiplexing characteristics.

Note that in the circuit configuration of the multiplexer 10J according to Modification 3, the capacitor C15 connected in series to the switch SW1 may be an inductor. In this case, the frequency shift of the attenuation pole is reversed between connection and disconnection of the switch SW1. Thus, if this configuration is applied to the above frequency allocation, in a case of CA mode 3, by disconnecting the switch SW1, the insertion loss at the lower end of Band C can be reduced. On the other hand, in a case of CA mode 4, by connecting the switch SW1, the isolation between Band A and Band D can be increased.

[1.10 Multiplexer According to Modification 4]

Figure 10A:
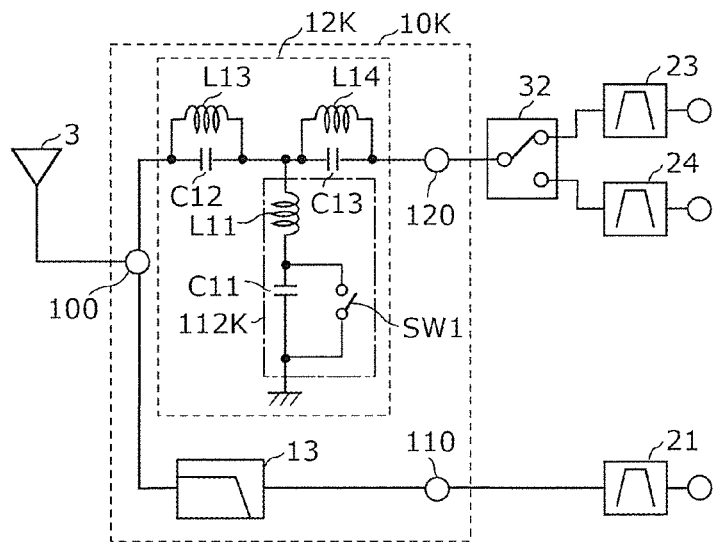
FIG. 10A illustrates a circuit configuration of a multiplexer according to Modification 4 and peripheral circuits thereof.

FIG. 10A illustrates a circuit configuration of a multiplexer 10K according to Modification 4 and peripheral circuits thereof. In the drawing, the multiplexer 10K according to Modification 4, the antenna element 3, the switch 32, and the filters 21, 23, and 24 are illustrated.

The multiplexer 10K according to Modification 4 is a modification of a specific circuit configuration of the multiplexer 10 according to the first embodiment and includes a high-pass filter 12K and the low-pass filter 13. The multiplexer 10K according to Modification 4 is different from the multiplexer 10F according to Modification 1 only in the configuration of the series-arm circuit in the high-pass filter 12K. Hereinafter, the same configuration of the multiplexer 10K according to Modification 4 as that of the multiplexer 10F according to Modification 1 will be omitted from the following description, and a different configuration will mainly be described.

The high-pass filter 12K includes the capacitors C12 and C13, the inductors L13 and L14, and a parallel-arm circuit 112K.

A series-arm circuit in which the capacitor C12 and the inductor L13 are connected in parallel and a series-arm circuit in which the capacitor C13 and the inductor L14 are connected in parallel are connected in series to each other on a path connecting the common terminal 100 and the input/output terminal 120. Each of the two series-arm circuits forms an LC parallel resonance circuit.

The parallel-arm circuit 112K is a first frequency-variable circuit connected between a connection node of the above two series-arm circuits and ground and having the same circuit configuration as the parallel-arm circuit 112F.

In this Modification, the high-pass filter 12K is the first filter, the low-pass filter 13 is the second filter, the input/output terminal 120 is the first input/output terminal, and the input/output terminal 110 is the second input/output terminal. In addition, the high band group is the first frequency band group, and the low band group is the second frequency band group.

Figure 10B:
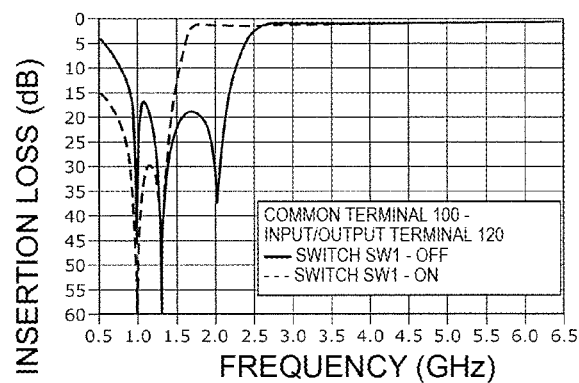
FIG. 10B is a graph illustrating bandpass characteristics of a high-pass filter in the multiplexer according to Modification 4.

FIG. 10B is a graph illustrating bandpass characteristics of the high-pass filter 12K in the multiplexer 10K according to Modification 4. As illustrated in the graph, by connecting (On) the switch SW1, the capacitor C11 that is connected in parallel to the switch SW1 is by-passed. Thus, although the parallel-arm circuit 112K no longer has a resonance point, two attenuation poles appear by LC parallel resonance of the two series-arm circuits (broken line in FIG. 10B). On the other hand, by disconnecting (Off) the switch SW1, the parallel-arm circuit 112K becomes an LC series resonance circuit and has a resonance point, and thus, three attenuation poles appear. This increases the attenuation amount on the low-frequency side of the pass band of the high-pass filter 12K (solid line in FIG. 10B). Thus, the attenuation amount of the attenuation band corresponding to the pass band of the low-pass filter 13 is increased. That is, the isolation between the high-pass filter 12K and the low-pass filter 13 is increased.

If the multiplexer 10K according to Modification 4 is, for example, applied to frequency allocation of Band A, Band C, and Band D in the ascending order of the frequencies, in a case of CA mode 3 using Band A and Band C, by connecting the switch SW1, the insertion loss at the lower end of Band C can be reduced. On the other hand, in a case of CA mode 4 using Band A and Band D, by disconnecting the switch SW1, the isolation between Band A and Band D can be increased.

Accordingly, even if the frequency band to be selected is changed in the multiplexer 10K executing CA between the so-called low band group and the high band group, it is possible to suppress increase in insertion loss or degradation of demultiplexing characteristics.

Figure 11A:
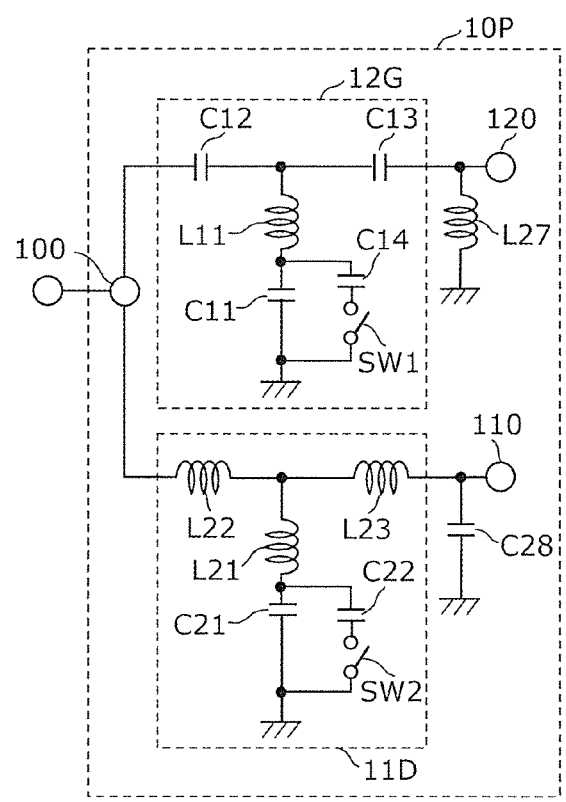
FIG. 11A illustrates a circuit configuration of a multiplexer according to Modification 5.

FIG. 11A illustrates a circuit configuration of a multiplexer 10P according to Modification 5. The multiplexer 10P according to this Modification includes the low-pass filter 11D, the high-pass filter 12G, an inductor L27, and a capacitor C28. The multiplexer 10P is different from the above multiplexers 10A to 10N in that circuit elements (the inductor L27 and the capacitor C28) for impedance matching with the circuits connected to the input/output terminals 110 and 120 are added. Hereinafter, the same configuration of the multiplexer 10P according to Modification 5 as that of the multiplexer 10D according to Example 4 will be omitted from the following description, and a different configuration will mainly be described.

The low-pass filter 11D has the same configuration as the low-pass filter 11D included in the multiplexer 10D according to Example 4. Therefore, the bandpass characteristics of the low-pass filter 11D will be omitted from the description.

The high-pass filter 12G has the same configuration as the high-pass filter 12G included in the multiplexer 10G according to Modification 2. Therefore, the bandpass characteristics of the high-pass filter 12G will be omitted from the description.

The capacitor C28 is connected between the input/output terminal 110 and ground. The capacitor C28 is a matching element for impedance matching between the low-pass filter 11D and circuits (e.g., the switch 31 and the filters 21 and 22 in FIG. 1A) connected to the input/output terminal 110.

The inductor L27 is connected between the input/output terminal 120 and ground. The inductor L27 is a matching element for impedance matching between the high-pass filter 12G and a circuit (e.g., the filter 23 in FIG. 1A) connected to the input/output terminal 120.

Note that the matching element connected to the input/output terminal 110 is not limited to the capacitor C28 and may be an inductor or a matching circuit constituted by series connection and parallel connection of one or more capacitors and one or more inductors. In addition, the matching element connected to the input/output terminal 120 is not limited to the inductor L27 and may be a capacitor or a matching circuit constituted by series connection and parallel connection of one or more capacitors and one or more inductors.

Figure 11B:
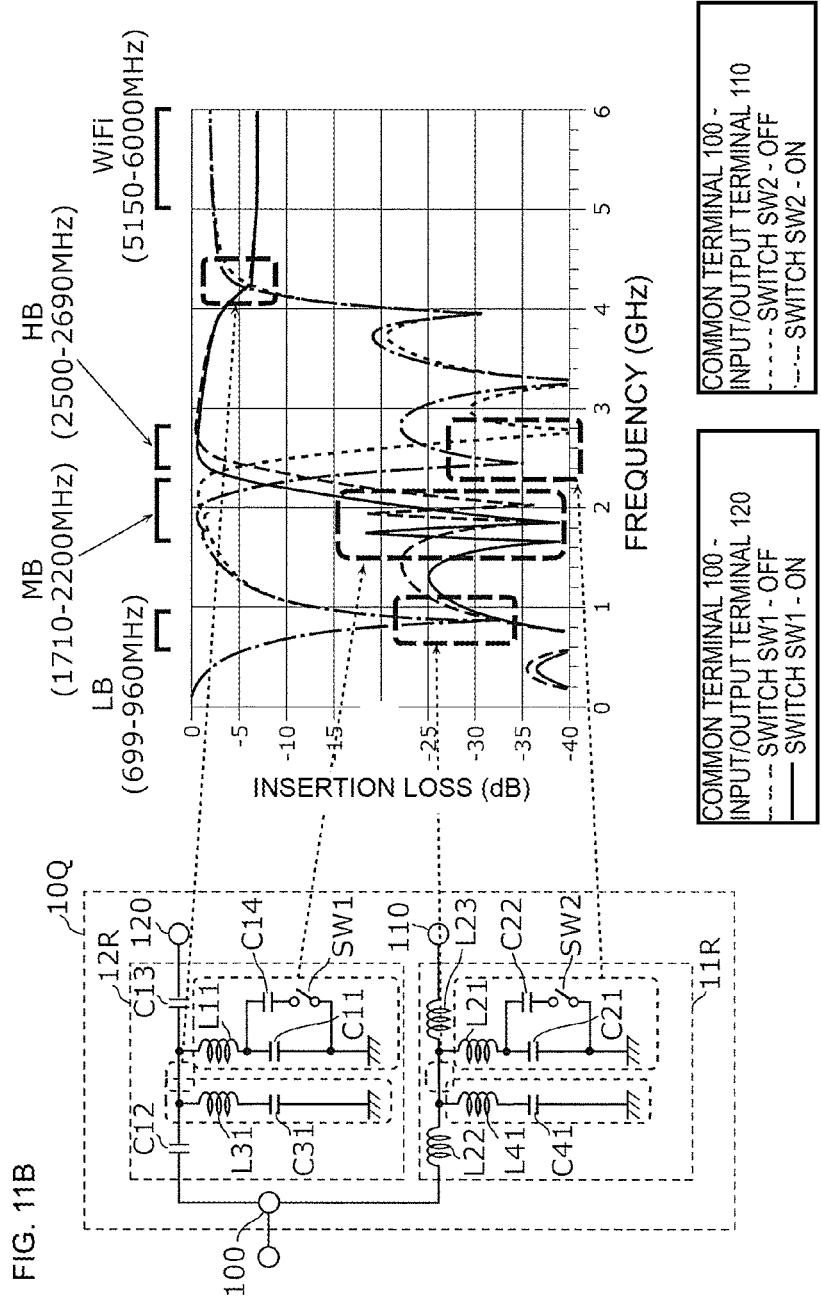
FIG. 11B illustrates a circuit configuration and bandpass characteristics of a multiplexer according to Modification 6.

FIG. 11B illustrates a circuit configuration and a graph illustrating bandpass characteristics of a multiplexer 10Q according to Modification 6. The multiplexer 10Q according to this Modification includes a low-pass filter 11R and a high-pass filter 12R. The multiplexer 10Q is different from the multiplexer 10p according to Modification 5 in that the matching elements (the inductor L27 and the capacitor C28) are not added and that an LC series resonance circuit is further added to a node above a series arm to which a parallel-arm circuit is connected. Hereinafter, the same configuration of the multiplexer 10Q according to Modification 6 as that of the multiplexer 10p according to Modification 5 will be omitted from the following description, and a different configuration will mainly be described.

The low-pass filter 11R includes the inductors L22 and L23 and parallel-arm circuits. The parallel-arm circuits include a first parallel-arm circuit and a second parallel-arm circuit that are connected between a connection node of the inductors L22 and L23 and ground.

The first parallel-arm circuit is a first frequency-variable circuit including the inductor L21, the capacitors C21 and C22, and the switch SW2. The inductor L21 and the capacitor C21 are connected in series between the connection node of the inductors L22 and L23 and ground. In addition, a circuit in which the switch SW2 and the capacitor C22 are connected in series is connected in parallel to the capacitor C21.

The second parallel-arm circuit is an LC series resonance circuit including an inductor L41 and a capacitor C41.

As described above, the first parallel-arm circuit and the second parallel-arm circuit are connected to the same connection node.

The first parallel-arm circuit operates in the same manner as the parallel-arm circuit 111D in the low-pass filter 11D according to Example 4. That is, if the switch SW2 is connected (On), the first parallel-arm circuit has a resonance point, and an attenuation pole (near HB) appears (long dashed short dashed line in FIG. 11B). On the other hand, if the switch SW2 is disconnected (Off), the first parallel-arm circuit has a resonance point on a higher frequency side than the resonance point during connection of the switch SW2, and thus, an attenuation pole appears on a higher frequency side than that during connection of the switch SW2. Thus, the insertion loss on the high-frequency side of the pass band (MB) of the low-pass filter 11R is reduced (broken line in FIG. 11B).

In addition, since the second parallel-arm circuit is arranged, a new attenuation pole can be provided (attenuation pole on a low-frequency side LB in FIG. 11B). Thus, while increase in the number of elements is suppressed, the low-pass filter 11R can serve as a band-pass filter.

The high-pass filter 12R includes the capacitors C12 and C13 and parallel-arm circuits. The parallel-arm circuits include a third parallel-arm circuit and a fourth parallel-arm circuit that are connected between a connection node of the capacitors C12 and C13 and ground.

The third parallel-arm circuit is a first frequency-variable circuit connected between the connection node of the capacitors C12 and C13 and ground and including the inductor L11, the capacitors C11 and C14, and the switch SW1. The inductor L11 and the capacitor C11 are connected in series between the connection node of the capacitors C12 and C13 and ground. In addition, a circuit in which the switch SW1 and the capacitor C14 are connected in series is connected in parallel to the capacitor C11.

The fourth parallel-arm circuit is an LC series resonance circuit including the inductor L31 and the capacitor C31.

As described above, the third parallel-arm circuit and the fourth parallel-arm circuit are connected to the same connection node.

The third parallel-arm circuit operates in the same manner as the parallel-arm circuit 112G in the low-pass filter 12G according to Modification 2. That is, if the switch SW1 is connected (On), the third parallel-arm circuit has a resonance point, and an attenuation pole (near MB) appears (solid line in FIG. 11B). On the other hand, if the switch SW1 is disconnected (Off), the third parallel-arm circuit has a resonance point on a higher frequency side than the resonance point during connection of the switch SW1, and thus, the attenuation pole appears on a higher frequency side than that during connection of the switch SW1. This increases the sharpness on the low-frequency side of the pass band (HB) of the high-pass filter 12R (double dashed broken line in FIG. 11B). Thus, the isolation between the high-pass filter 12R and the low-pass filter 11R is increased.

In addition, since the fourth parallel-arm circuit is arranged, a new attenuation pole can be provided (attenuation in a high-frequency side WiFi band in FIG. 11B). Thus, while increase in the number of elements is suppressed, the high-pass filter 12R can serve as a band-pass filter.

Second Embodiment

In the first embodiment, one of the plurality of filters constituting the multiplexer is a frequency-variable filter. In contrast, a multiplexer according to this embodiment has a configuration in which two of a plurality of filters constituting the multiplexer are frequency-variable filters.

[2.1 Configuration of Radio-Frequency Front-End Circuit]

Figure 12:
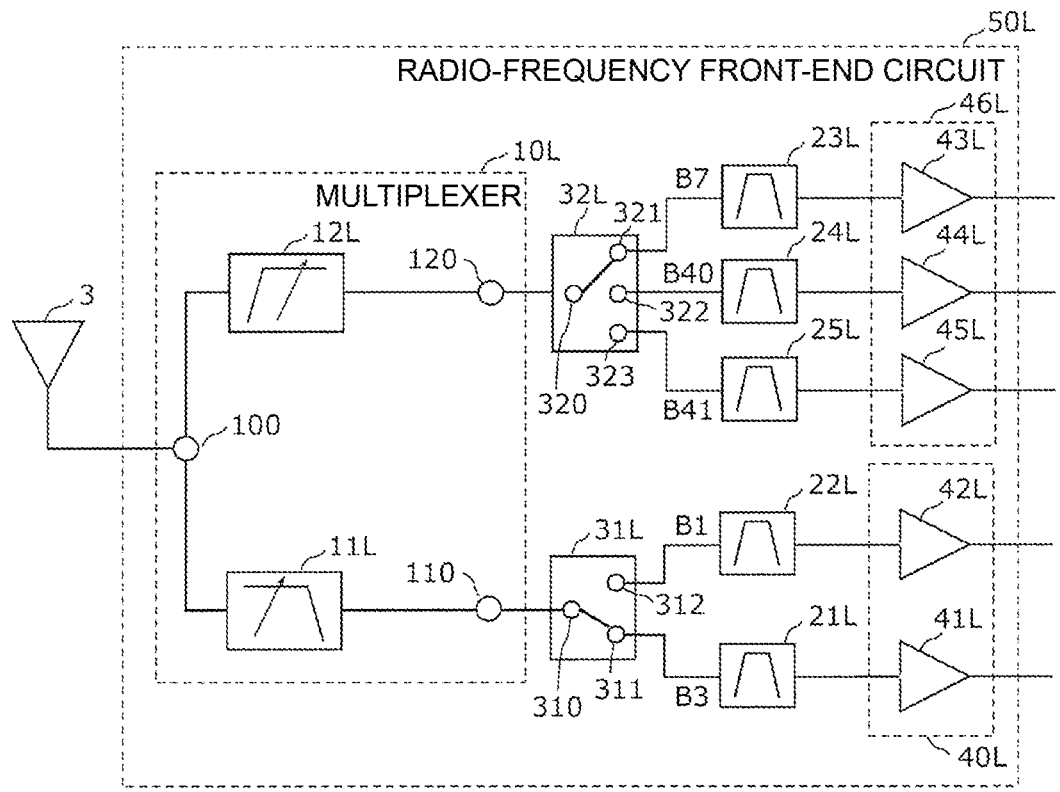
FIG. 12 illustrates a configuration of a radio-frequency front-end circuit according to a second embodiment.

FIG. 12 illustrates a configuration of a radio-frequency front-end circuit 50L according to the second embodiment. As illustrated in the drawing, the radio-frequency front-end circuit 50L is a front-end circuit for reception and includes a multiplexer 10L, switches 31L and 32L, filters 21L, 22L, 23L, 24L and 25L, and reception amplifiers 41L, 42L, 43L, 44L, and 45L.

The multiplexer 10L includes the common terminal 100, the input/output terminals 110 and 120, a low-pass filter 11L, and a high-pass filter 12L.

The low-pass filter 11L is disposed between the common terminal 100 and the input/output terminal 110. The low-pass filter 11L is a low-pass filter whose pass band is frequencies in a low band group and whose attenuation band is frequencies in a high band group. The low-pass filter 11L includes a first frequency-variable circuit including a first switching element. In accordance with connection or disconnection of the first switching element, at least one of the pass band and the attenuation band of the low-pass filter 11L is changeable.

The high-pass filter 12L is disposed between the common terminal 100 and the input/output terminal 120. The high-pass filter 12L is a high-pass filter whose pass band is the frequencies in the high band group and whose attenuation band is the frequencies in the low band group. The high-pass filter 12L includes a second frequency-variable circuit including a second switching element. In accordance with connection or disconnection of the second switching element, at least one of the pass band and the attenuation band of the high-pass filter 12L is changeable.

Note that in this embodiment, a frequency-variable filter including the first switching element is defined as a first filter, and a frequency-variable filter including the second switching element is defined as a second filter. In addition, an input/output terminal connected to the first filter is defined as a first input/output terminal, and an input/output terminal connected to the second filter is defined as a second input/output terminal. The pass band of the first filter is switched between a first frequency band and a second frequency band in accordance with connection or disconnection of the first switching element. The pass band of the second filter is switched between a third frequency band and a fourth frequency band in accordance with connection or disconnection of the second switching element. The first frequency band and the second frequency band belong to a first frequency band group, and the third frequency band and the fourth frequency band belong to a second frequency band group.

Therefore, in the multiplexer 10L illustrated in FIG. 12, the low-pass filter 11L is the first filter, the high-pass filter 12L is the second filter, the input/output terminal 110 is the first input/output terminal, and the input/output terminal 120 is the second input/output terminal. In addition, the low band group is the first frequency band group, and the high band group is the second frequency band group.

The switch 31L is a third switching element including the common terminal 310 (second common terminal), the selection terminal 311 (first selection terminal), and the selection terminal 312 (second selection terminal), in which the common terminal 310 is connected to the input/output terminal 110. The switch 31L is an SPDT switching circuit that can connect the common terminal 310 and any of the selection terminals 311 and 312.

The switch 32L is a fourth switching element including the common terminal 320 (second common terminal), the selection terminal 321 (fourth selection terminal), the selection terminal 322, and a selection terminal 323 (third selection terminal), in which the common terminal 320 is connected to the input/output terminal 120. The switch 32L is an SP3T switching circuit that can connect the common terminal 320 and any of the selection terminals 321, 322, and 323.

The filter 21L is a band-pass filter that is connected to the selection terminal 311 and whose pass band is, for example, Band 3 (reception band: 1805-1880 MHz) for LTE (Long Term Evolution). The filter 22L is a band-pass filter that is connected to the selection terminal 312 and whose pass band is, for example, Band 1 (reception band: 2110-2170 MHz) for LTE. The filter 23L is a band-pass filter that is connected to the selection terminal 321 and whose pass band is, for example, Band 7 (reception band: 2620-2690 MHz) for LTE. The filter 24L is a band-pass filter that is connected to the selection terminal 322 and whose pass band is, for example, Band 40 (reception band: 2300-2400 MHz) for LTE. The filter 25L is a band-pass filter that is connected to the selection terminal 323 and whose pass band is, for example, Band 41 (reception band: 2496-2690 MHz) for LTE.

In the radio-frequency front-end circuit 50L illustrated in FIG. 12, the filter 21L is a third filter whose pass band is the first frequency band, the filter 22L is a fourth filter whose pass band is the second frequency band, the filters 24L and 25L are each a fifth filter whose pass band is the third frequency band, and the filter 23L is a sixth filter whose pass band is the fourth frequency band.

The reception amplifier 41L is connected to the filter 21L, the reception amplifier 42L is connected to the filter 22L, the reception amplifier 43L is connected to the filter 23L, the reception amplifier 44L is connected to the filter 24L, and the reception amplifier 45L is connected to the filter 25L. Each of the reception amplifiers 41L to 45L is, for example, a low-noise amplifier constituted by a transistor and the like. The reception amplifiers 41L and 42L constitute an amplifier circuit 40L (first amplifier circuit). The reception amplifiers 43L to 45L constitute an amplifier circuit 46L (second amplifier circuit). Note that the amplifier circuits 40L and 46L may each be constituted by a single reception amplifier, in which case an SPDT switch is arranged between the filter 21L and the amplifier circuit 40L and between the filter 22L and the amplifier circuit 40L and an SP3T switch is arranged between the filter 23L and the amplifier circuit 46L, between the filter 24L and the amplifier circuit 46L, and between the filter 25L and the amplifier circuit 46L.

The five bands for LTE illustrated in this embodiment are Band 3, Band 1, Band 40, Band 41, and Band 7 in the ascending order of the frequencies. Band 3 and Band 1 belong to the low band group, and Band 40, Band 41, and Band 7 belong to the high band group.

In the multiplexer 10L according to this embodiment, for example, (1) in CA mode 2 in which Band 1 that belongs to the low band group and Band 40 that belongs to the high band group are concurrently used and (2) in CA mode 1 in which Band 3 that belongs to the low band group and Band 40 that belongs to the high band group are concurrently used, the frequency interval between two concurrently used frequency bands differs. The frequency interval in CA mode 1 is larger than the frequency interval in CA mode 2.

In contrast, according to the multiplexer 10L, in accordance with one of connection and disconnection of the first switching element, at least one of the pass band and the attenuation band of the low-pass filter 11L is changeable. Thus, for example, (1) in a case of CA mode 2 in which the frequency interval between two concurrently used frequency bands is small, the pass band of the low-pass filter 11L is made closer to the pass band of the high-pass filter 12L. This can suppress increase in insertion loss on the pass band side of the high-pass filter 12L in the pass band of the low-pass filter 11L (at the higher end of the pass band of the low-pass filter 11L). In other words, it is possible to suppress increase in insertion loss at the higher end of the pass band of the filter 22L connected in the following stage of the low-pass filter 11L.

In addition, according to the multiplexer 10L, in accordance with the other of connection and disconnection of the first switching element, for example, (2) in a case of CA mode 1 in which the frequency interval between two concurrently used frequency bands is large, the attenuation band of the low-pass filter 11L, located between the pass band of the low-pass filter 11L and the pass band of the high-pass filter 12L, is made closer to the pass band side (on the low-frequency side) of the low-pass filter 11L. This can increase the isolation between the low-pass filter 11L and the high-pass filter 12L.

In addition, in the multiplexer 10L according to this embodiment, for example, (1) in CA mode 3 in which Band 40 (or Band 41) that belongs to the high band group and Band 1 that belongs to the low band group are concurrently used and (2) in CA mode 4 in which Band 7 that belongs to the high band group and Band 1 that belongs to the low band group are concurrently used, the frequency interval between two concurrently used frequency bands differs. The frequency interval in CA mode 4 is larger than the frequency interval in CA mode 3.

According to the above configuration, in accordance with one of connection and disconnection of the second switching element, at least one of the pass band and the attenuation band of the high-pass filter 12L is changeable. Thus, for example, (1) in a case of CA mode 3 in which the frequency interval between two concurrently used frequency bands is small, the pass band of the high-pass filter 12L is made closer to the pass band of the low-pass filter 11L. This can suppress increase in insertion loss on the pass band side of the low-pass filter 11L in the pass band of the high-pass filter 12L (at the lower end of the pass band of the high-pass filter 12L).

In addition, according to the multiplexer 10L, in accordance with the other of connection and disconnection of the second switching element, for example, (2) in a case of CA mode 4 in which the frequency interval between two concurrently used frequency bands is large, the attenuation band of the high-pass filter 12L, located between the pass band of the high-pass filter 12L and the pass band of the low-pass filter 11L, is made closer to the pass band of the high-pass filter 12L. This can increase the isolation between the low-pass filter 11L and the high-pass filter 12L.

Furthermore, since both the low-pass filter 11L and the high-pass filter 12L are frequency-variable, whatever combination is selected in CA using any of frequency bands that belong to the low band group and any of frequency bands that belong to the high band group, the pass bands and the attenuation bands of the low-pass filter 11L and the high-pass filter 12L can be optimized.

Accordingly, even if the frequency band to be selected is changed in the multiplexer 10L executing CA between the so-called low band group and the high band group, it is possible to suppress increase in insertion loss or degradation of demultiplexing characteristics.

Now, an example of a specific circuit configuration of the multiplexer according to the second embodiment will be described below with reference to Example 6.

[2.2 Multiplexer According to Example 6]

Figure 13A:
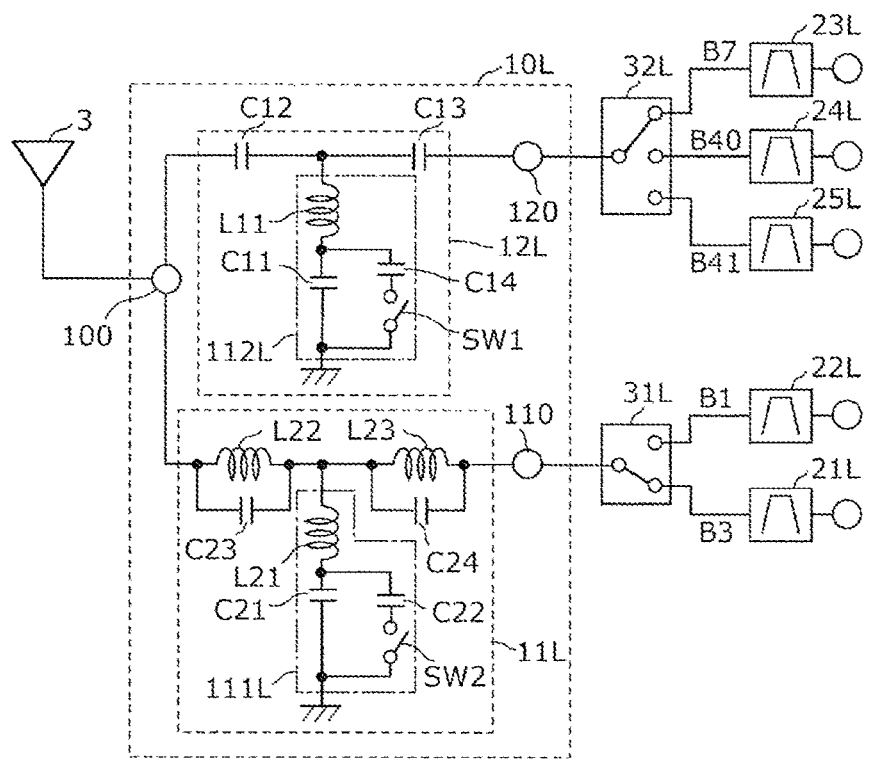
FIG. 13A illustrates a circuit configuration of a multiplexer according to Example 6 and peripheral circuits thereof.

FIG. 13A illustrates a circuit configuration of the multiplexer 10L according to Example 6 and peripheral circuits thereof. In the drawing, the multiplexer 10L according to Example 6, the antenna element 3, the switches 31L and 32L, and the filters 21L to 25L are illustrated.

The multiplexer 10L according to Example 6 is an example of a specific circuit configuration of the multiplexer 10L illustrated in FIG. 12 and includes the low-pass filter 11L and the high-pass filter 12L.

The low-pass filter 11L includes the inductors L22 and L23, the capacitors C23 and C24, and a parallel-arm circuit 111L.

A series-arm circuit in which the inductor L22 and the capacitor C23 are connected in parallel and a series-arm circuit in which the inductor L23 and the capacitor C24 are connected in parallel are connected in series to each other on a path connecting the common terminal 100 and the input/output terminal 110. Each of the two series-arm circuits forms an LC parallel resonance circuit.

The parallel-arm circuit 111L is a first frequency-variable circuit connected between a connection node of the above two series-arm circuits and ground and having the same circuit configuration as the parallel-arm circuit 111D according to Example 4.

The high-pass filter 12L includes the capacitors C12 and C13 and a parallel-arm circuit 112L. The parallel-arm circuit 112L is a second frequency-variable circuit having substantially the same circuit configuration as the parallel-arm circuit 112G according to Modification 2 of the first embodiment.

In this Example, the low-pass filter 11L is the first filter, the high-pass filter 12L is the second filter, the input/output terminal 110 is the first input/output terminal, and the input/output terminal 120 is the second input/output terminal. In addition, the low band group is the first frequency band group, and the high band group is the second frequency band group.

Figure 13B:
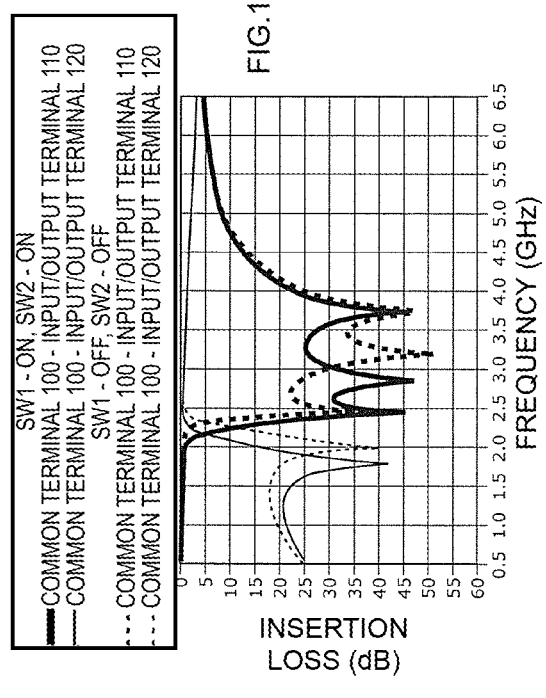
FIGS. 13BA-13BC are graphs illustrating bandpass characteristics and isolation characteristics of the multiplexer according to Example 6.
Figure 13B:
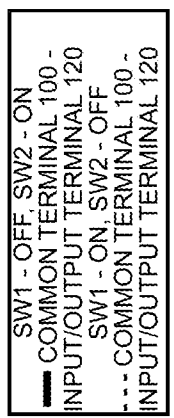
Figure 13B:
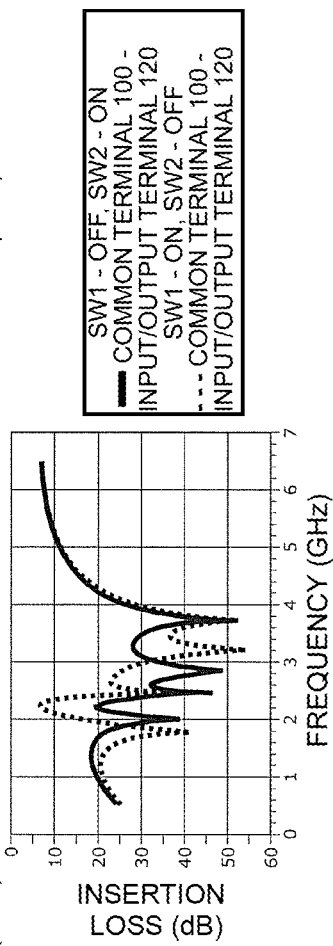
Figure 13B:
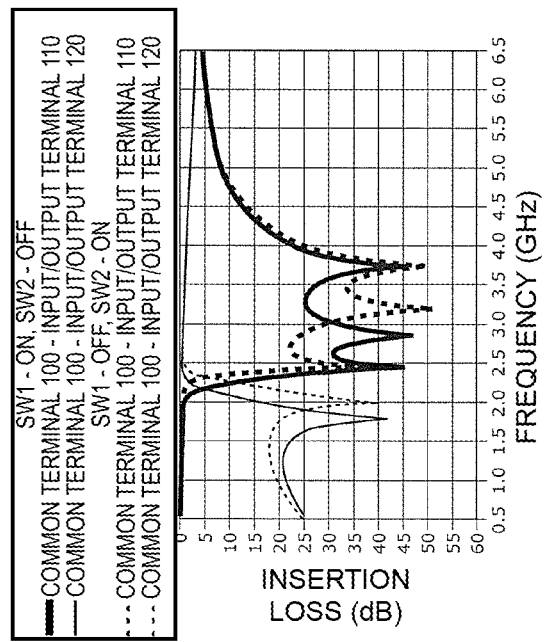

FIGS. 13BA-13BC are graphs illustrating bandpass characteristics and isolation characteristics of the multiplexer 10L according to Example 6. FIG. 13BA illustrates (1) bandpass characteristics of the low-pass filter 11L (thick solid line) and bandpass characteristics of the high-pass filter 12L (thin solid line) if the switch SW1 is connected and the switch SW2 is disconnected and (2) bandpass characteristics of the low-pass filter 11L (thick broken line) and bandpass characteristics of the high-pass filter 12L (thin broken line) if the switch SW1 is disconnected and the switch SW2 is connected. FIG. 13BB illustrates (1) bandpass characteristics of the low-pass filter 11L (thick solid line) and bandpass characteristics of the high-pass filter 12L (thin solid line) if both the switch SW1 and the switch SW2 are connected and (2) bandpass characteristics of the low-pass filter 11L (thick broken line) and bandpass characteristics of the high-pass filter 12L (thin broken line) if both the switch SW1 and the switch SW2 are disconnected. FIG. 13BC illustrates (1) isolation characteristics between the low-pass filter 11L and the high-pass filter 12L (thick solid line) if the switch SW1 is disconnected and the switch SW2 is connected and (2) isolation characteristics between the low-pass filter 11L and the high-pass filter 12L (thick broken line) if the switch SW1 is connected and the switch SW2 is disconnected.

As illustrated in FIGS. 13BA and 13BB, in the low-pass filter 11L, since the capacitor C22 is connected in series to the switch SW2, even if the switch SW2 is connected (On), the parallel-arm circuit 111L becomes an LC series resonance circuit of a parallel composite capacitor of the capacitors C21 and C22 and the inductor L21. By LC parallel resonance of the LC series resonance circuit and two series-arm circuits, three attenuation poles appear (thick solid line in FIG. 13BA and thick solid line in FIG. 13BB). On the other hand, if the switch SW2 is disconnected (Off), the parallel-arm circuit 111L becomes an LC series resonance circuit of the inductor L21 and the capacitor C21 and has a resonance point on a higher frequency side than the resonance point during connection of the switch SW2. Thus, the attenuation poles are shifted to a higher frequency side than those during connection of the switch SW2 (thick broken line in FIG. 13BA and thick broken line in FIG. 13BB). This reduces the insertion loss at the higher end of the pass band of the low-pass filter 11L.

As illustrated in FIGS. 13BA and 13BB, since the capacitor C14 is connected in series to the switch SW1, even if the switch SW1 is connected (On), the parallel-arm circuit 112L becomes an LC series resonance circuit of a parallel composite capacitor of the capacitors C11 and C14 and the inductor L11 and has a resonance point, and thus, an attenuation pole appears (thin solid line in FIG. 13BA and thin solid line in FIG. 13BB). On the other hand, if the switch SW1 is disconnected (Off), the parallel-arm circuit 112L becomes an LC series resonance circuit of the capacitor C11 and the inductor L11 and has a resonance point on a higher frequency side than the resonance point during connection of the switch SW1, and thus, an attenuation pole appears on a higher frequency side than that during connection of the switch SW1. This increases the sharpness on the low-frequency side of the pass band of the high-pass filter 12L (thin broken line in FIG. 13BA and thin broken line in FIG. 13BB). This increases the isolation between the high-pass filter 12L and the low-pass filter 11L.

For example, as illustrated in FIG. 13BA, if the switch SW1 is connected and the switch SW2 is disconnected, the pass band of the high-pass filter 12L and the pass band of the low-pass filter 11L approach each other. On the other hand, if the switch SW1 is disconnected and the switch SW2 is connected, the pass band of the high-pass filter 12L and the pass band of the low-pass filter 11L become away from each other. In this case, as illustrated in FIG. 13BC, if the switch SW1 is disconnected and the switch SW2 is connected, the isolation between the high-pass filter 12L and the low-pass filter 11L is increased.

In the multiplexer 10L having the above characteristics, for example, (1) in a case of CA mode using Band 3 and Band 40, as illustrated in FIG. 13BB, the switches SW1 and SW2 are connected. This shifts the pass bands of both the high-pass filter 12L and the low-pass filter 11L to the low-frequency side. In contrast, (2) in a case of CA mode using Band 1 and Band 7, as illustrated in FIG. 13BB, the switches SW1 and SW2 are disconnected. This shifts the pass bands of both the high-pass filter 12L and the low-pass filter 11L to the high-frequency side. In addition, (3) in a case of CA mode using Band 3 and Band 7, as illustrated in FIG. 13BA, the switch SW1 is disconnected and the switch SW2 is connected. This shifts the pass band of the high-pass filter 12L to the high-frequency side and the pass band of the low-pass filter 11L to the low-frequency side. Furthermore, (4) in a case of CA mode using Band 1 and Band 40, as illustrated in FIG. 13BA, the switch SW1 is connected and the switch SW2 is disconnected. This shifts the pass band of the high-pass filter 12L to the low-frequency side and the pass band of the low-pass filter 11L to the high-frequency side. In addition, in the multiplexer 10L, the high-pass filter 12L may include Band 41 (reception band: 2496-2690 MHz) for LTE, and the low-pass filter 11L may include Band 65 (reception band: 2110-2200 MHz) for LTE.

Accordingly, even if the frequency band to be selected is changed in the multiplexer 10L executing CA between the so-called low band group and the high band group, it is possible to suppress increase in insertion loss or degradation of demultiplexing characteristics.

Although the multiplexer 10L constituted by the high-pass filter 12L and the low-pass filter 11L has been illustrated as the multiplexer according to Example 6, the multiplexer according to this Example may be any of the multiplexers 10A, 10B, 10C, 10D, 10E, 10F, 10G, 10J, 10P, and 10Q according to Examples 1 to 5 and Modifications 1 to 6.

Other Embodiments

A multiplexer, a radio-frequency front-end circuit, and a communication apparatus according to the present disclosure have been described above with reference to embodiments, Examples, and Modifications. However, the present disclosure is not limited to the above embodiments, Examples, and Modifications. The present disclosure also includes other embodiments implemented by combining any of the components in the embodiments, Examples, and Modifications described above, modifications obtained by making various modifications conceived of by a person skilled in the art to the embodiments described above without necessarily departing from the spirit of the present disclosure, and various devices including the multiplexer, the radio-frequency front-end circuit, and the communication apparatus according to the present disclosure.

Note that the low band group and the high band group described in the above embodiments merely refer to a band group of relatively low frequencies and a band group of relatively high frequencies, respectively.

Therefore, in the circuit configurations described in the above embodiments, the combination of the low band group/ the high band group may be a combination of any two frequency band groups (which may be the same frequency band) from the following (1) to (5).

(1) LB (699-960 MHz)
(2) MLB (1427-1511 MHz)
(3) MB (1710-2200 MHz)
(4) HB (2300-2690 MHz)

(5) UHB (3300-5000 MHz)

For example, the following combinations (A) to (D) can be given.

(A) LB/MB
(B) MLB/MB
(C) HB/UHB
(D) UHB/UHB

Note that two or more frequency bands (bands) may belong to each of the frequency band groups.

In addition, although a diplexer in which two frequency band groups are to be demultiplexed has been described above as an example of the multiplexer, three or more frequency band groups may be demultiplexed. For example, the may demultiplex LB/MLB/MB/HB.

In addition, for example, in the multiplexer, the radio-frequency front-end circuit, and the communication apparatus according to the embodiments, a matching element such as an inductor or a capacitor and a switching circuit may be connected between components. Note that the inductor may include wiring inductor constituted by a line connecting the components.

Although the radio-frequency front-end circuit according to the embodiments is a reception circuit, a transmission circuit may be used. In this case, instead of a reception amplifier circuit, a transmission amplifier circuit, such as a power amplifier, is arranged. Furthermore, the radio-frequency front-end circuit may include both a reception signal path and a transmission signal path.

In addition, although in the multiplexer according to the first embodiment and the second embodiment, each of the high-pass filter and the low-pass filter includes a parallel-arm circuit (frequency-variable circuit), a plurality of parallel-arm circuits may also be arranged. Along with this, three or more series-arm circuits may also be arranged. By including a plurality of parallel-arm circuits and a plurality of series-arm circuits, the number of attenuation poles in filter bandpass characteristics can be increased, and thus, for example, the filter characteristics sharpness and the degree of design freedom of the attenuation band are increased.

INDUSTRIAL APPLICABILITY

The present disclosure is widely used for a communication device, such as a mobile phone, as a multiplexer, a radio-frequency front-end circuit, and a communication apparatus that can be applied to a multiband system executing CA mode.

REFERENCE SIGNS LIST 1 communication apparatus
3 antenna element
4 RF signal processing circuit (RFIC)
5 baseband signal processing circuit (BBIC)
10, 10A, 10B, 10C, 10D, 10E, 10F, 10G, 10J, 10K, 10L, 10P, 10Q multiplexer
11, 11A, 11B, 11C, 11D, 11E, 11L, 11M, 11N, 11P, 11R, 13 low-pass filter
12, 12F, 12G, 12J, 12K, 12L, 12M, 12N, 12P, 12R high-pass filter
21, 21L, 22, 22L, 23, 23L, 24, 24L, 25L filter
31, 31L, 32, 32L switch
40, 40L, 46L amplifier circuit
41, 41L, 42, 42L, 43, 43L, 44L, 45L reception amplifier
50, 50L radio-frequency front-end circuit
100, 310, 320 common terminal
110, 120 input/output terminal
111A, 111B, 111C, 111D, 111E, 111L, 112F, 112G, 112J, 112K, 112L parallel-arm circuit
311, 312, 321, 322, 323 selection terminal
C11, C12, C13, C14, C15, C16, C17, C21, C22, C23, C24, C25, C26, C27, C28, C31, C41 capacitor
L11, L13, L14, L21, L22, L23, L24, L25, L26, L27, L31, L41 inductor
SW1, SW2 switch

The invention claimed is:

1. A multiplexer configured to concurrently send a radio-frequency signal in a first frequency band or a second frequency band, and a radio-frequency signal in a third frequency band, the first frequency band and the second frequency band belonging to a first frequency band group, and the third frequency band belonging to a second frequency band group, and that is configured to exclusively send the radio-frequency signal in the first frequency band and the radio-frequency signal in the second frequency band, the multiplexer comprising:
a first common terminal, a first input/output terminal, and a second input/output terminal;
a first filter between the first common terminal and the first input/output terminal, the first filter having a pass band comprising frequencies in the first frequency band group and having an attenuation band comprising frequencies in the second frequency band group; and
a second filter between the first common terminal and the second input/output terminal, the second filter having a pass band comprising frequencies in the second frequency band group and having an attenuation band comprising frequencies in the first frequency band group,
wherein the first filter comprises a first frequency-variable circuit, the first frequency-variable circuit comprising a first switch and an LC series circuit comprising an inductor and a capacitor connected in series, the first switch being connected to an end of the LC series circuit,
wherein the first frequency-variable circuit is connected between a node and ground, the node being on a first path connecting the first common terminal and the first input/output terminal, and the LC series circuit being directly connected to the node, and
wherein the pass band of the first filter or the attenuation band of the first filter is configured to change in accordance with a state of the first switch.

2. The multiplexer according to claim 1,
wherein at least part of the second frequency band is between the first frequency band and the third frequency band, and
wherein, in accordance with the state of the first switch:
(1) when sending a radio-frequency signal in the second frequency band, an end of the pass band of the first filter on a second frequency band group side of the pass band of the first filter is configured to shift toward the second frequency band group side, and
(2) when sending a radio-frequency signal in the first frequency band, an end of the attenuation band of the first filter on a first frequency band group side of the attenuation band of the first filter is configured to shift toward the first frequency band group side, the attenuation band of the first filter being between the pass band of the first filter and the pass band of the second filter.

3. The multiplexer according to claim 1,
wherein the first frequency band group comprises lower frequencies than the second frequency band group, wherein the first filter is a low-pass filter comprising an inductor in series in the first path connecting the first common terminal and the first input/output terminal, and wherein the second filter is a high-pass filter comprising a capacitor in series in second a path connecting the first common terminal and the second input/output terminal.

4. The multiplexer according to claim 1, wherein the first frequency band group comprises frequencies higher than the second frequency band group, wherein the first filter is a high-pass filter comprising a capacitor in series in the first path connecting the first common terminal and the first input/output terminal, and wherein the second filter is a low-pass filter comprising an inductor in series in a second path connecting the first common terminal and the second input/output terminal.

5. The multiplexer according to claim 1, wherein the first frequency band group comprises the first frequency band and the second frequency band, wherein the second frequency band group comprises the third frequency band and a fourth frequency band, wherein the multiplexer is configured to:

(1) exclusively send the radio-frequency signal in the first frequency band and the radio-frequency signal in the second frequency band, (2) exclusively send the radio-frequency signal in the third frequency band and a radio-frequency signal in the fourth frequency band, and (3) concurrently send the radio-frequency signal in the first frequency band or the second frequency band, and the radio-frequency signal in the third frequency band or the fourth frequency band, wherein the second filter comprises a second frequency-variable circuit, the second frequency-variable circuit comprising a second switch, and wherein the pass band of the second filter or the attenuation band of the second filter is configured to change in accordance with a state of the second switch.

6. The multiplexer according to claim 5, wherein at least part of the third frequency band is between the second frequency band and the fourth frequency band, and wherein, in accordance with the state of the first switch and the state of the second switch:

(1) when sending the radio-frequency signal in the first frequency band and the radio-frequency signal in the third frequency band, an end of the attenuation band of the first filter on a first frequency band group side of the attenuation band of the first filter is configured to shift toward the first frequency band group side, and an end of the pass band of the second filter on the first frequency band group side of the pass band of the second filter is configured to shift toward the first frequency band group side, the attenuation band of the first filter being between the pass band of the first filter and the pass band of the second filter, (2) when sending the radio-frequency signal in the second frequency band and the radio-frequency signal in the fourth frequency band, an end of the attenuation band of the second filter on a second frequency band group side of the attenuation band of the second filter is configured to shift toward the second frequency band group side, and an end of the pass band of the first filter on the second frequency band group side of the pass band of the first filter is configured to shift toward the second frequency band group side, the attenuation band of the second filter being between the pass band of the first filter and the pass band of the second filter, and (3) when sending the radio-frequency signal in the second frequency band and the radio-frequency signal in the third frequency band, the end of the pass band of the first filter on the second frequency band group side of the pass band of first filter is configured to shift toward the second frequency band group side and the end of the pass band of the second filter on the first frequency band group side of the pass band of the second filter is configured to shift toward the first frequency band group side, and (4) when sending the radio-frequency signal in the first frequency band and the radio-frequency signal in the fourth frequency band, the end of the attenuation band of the first filter on the first frequency band group side of the attenuation band of the first filter is configured to shift toward the first frequency band group side, and the end of the attenuation band of the second filter on the second frequency band group side of the attenuation band of the second filter is configured to shift toward the second frequency band group side, the attenuation bands of the first and second filters being between the pass band of the first filter and the pass band of the second filter.

7. A radio-frequency front-end circuit comprising:

the multiplexer according to claim 1;

a third switch comprising a second common terminal, a first selection terminal, and a second selection terminal, wherein the second common terminal is connected to the first input/output terminal;

a third filter connected to the first selection terminal, the third filter having a pass band comprising the first frequency band;

a fourth filter connected to the second selection terminal, the fourth filter having a pass band comprising the second frequency band;

a fifth filter connected to the second input/output terminal, the fifth filter having a pass band comprising the third frequency band;

a first amplifier circuit connected to the third filter and the fourth filter; and a second amplifier circuit connected to the fifth filter.

8. A radio-frequency front-end circuit comprising:

the multiplexer according to claim 5;

a third switch comprising a second common terminal, a first selection terminal, and a second selection terminal, wherein the second common terminal is connected to the first input/output terminal;

a fourth switch comprising a third common terminal, a third selection terminal, and a fourth selection terminal, wherein the third common terminal is connected to the second input/output terminal;

a third filter connected to the first selection terminal, the third filter having a pass band comprising the first frequency band;

a fourth filter connected to the second selection terminal, the fourth filter having a pass band comprising the second frequency band;

a fifth filter connected to the third selection terminal, the fifth filter having a pass band comprising the third frequency band;

a sixth filter connected to the fourth selection terminal, the sixth filter having a pass band comprising the fourth frequency band;

a first amplifier circuit connected to the third filter and the fourth filter; and a second amplifier circuit connected to the fifth filter and the sixth filter.

9. A communication apparatus comprising:

a radio-frequency (RF) signal processing circuit configured to process a radio-frequency signal received by an antenna; and the radio-frequency front-end circuit according to claim 7, the radio-frequency front-end circuit being configured to send the radio-frequency signal between the antenna and the RF signal processing circuit.

10. A multiplexer configured to concurrently send a radio-frequency signal in a first frequency band or a second frequency band, and a radio-frequency signal in a third frequency band, the first frequency band and the second frequency band belonging to a first frequency band group, and the third frequency band and a fourth frequency band belonging to a second frequency band group, and that is configured to exclusively send the radio-frequency signal in the first frequency band and the radio-frequency signal in the second frequency band, the multiplexer comprising:

a first common terminal, a first input/output terminal, and a second input/output terminal;

a first filter between the first common terminal and the first input/output terminal, the first filter having a pass band comprising frequencies in the first frequency band group and having an attenuation band comprising frequencies in the second frequency band group; and a second filter between the first common terminal and the second input/output terminal, the second filter having a pass band comprising frequencies in the second frequency band group and having an attenuation band comprising frequencies in the first frequency band group, wherein the multiplexer is configured to:
(1) exclusively send the radio-frequency signal in the first frequency band and the radio-frequency signal in the second frequency band,
(2) exclusively send the radio-frequency signal in the third frequency band and a radio-frequency signal in the fourth frequency band, and
(3) concurrently send the radio-frequency signal in the first frequency band or the second frequency band, and the radio-frequency signal in the third frequency band or the fourth frequency band, wherein at least part of the third frequency band is between the second frequency band and the fourth frequency band, wherein the first filter comprises a first frequency-variable circuit, the first frequency-variable circuit comprising a first switch, wherein the second filter comprises a second frequency-variable circuit, the second frequency-variable circuit comprising a second switch, wherein the pass band of the first filter or the attenuation band of the first filter is configured to change in accordance with a state of the first switch, wherein the pass band of the second filter or the attenuation band of the second filter is configured to change in accordance with a state of the second switch, and wherein, in accordance with the state of the first switch and the state of the second switch:

(1) when sending the radio-frequency signal in the first frequency band and the radio-frequency signal in the third frequency band, an end of the attenuation band of the first filter on a first frequency band group side of the attenuation band of the first filter is configured to shift toward the first frequency band group side, and an end of the pass band of the second filter on the first frequency band group side of the pass band of the second filter is configured to shift toward the first frequency band group side, the attenuation band of the first filter being between the pass band of the first filter and the pass band of the second filter, (2) when sending the radio-frequency signal in the second frequency band and the radio-frequency signal in the fourth frequency band, an end of the attenuation band of the second filter on a second frequency band group side of the attenuation band of the second filter is configured to shift toward the second frequency band group side, and an end of the pass band of the first filter on the second frequency band group side of the pass band of the first filter is configured to shift toward the second frequency band group side, the attenuation band of the second filter being between the pass band of the first filter and the pass band of the second filter, and (3) when sending the radio-frequency signal in the second frequency band and the radio-frequency signal in the third frequency band, the end of the pass band of the first filter on the second frequency band group side of the pass band of first filter is configured to shift toward the second frequency band group side and the end of the pass band of the second filter on the first frequency band group side of the pass band of the second filter is configured to shift toward the first frequency band group side, and (4) when sending the radio-frequency signal in the first frequency band and the radio-frequency signal in the fourth frequency band, the end of the attenuation band of the first filter on the first frequency band group side of the attenuation band of the first filter is configured to shift toward the first frequency band group side, and the end of the attenuation band of the second filter on the second frequency band group side of the attenuation band of the second filter is configured to shift toward the second frequency band group side, the attenuation bands of the first and second filters being between the pass band of the first filter and the pass band of the second filter.

* * * * *

UNITED STATES PATENT AND TRADEMARK OFFICE
CERTIFICATE OF CORRECTION

PATENT NO. : 11,095,321 B2
APPLICATION NO. : 16/855401
DATED : August 17, 2021
INVENTOR(S) : Taizo Hisano et al.

It is certified that error appears in the above-identified patent and that said Letters Patent is hereby corrected as shown below:

In the Specification

Column 9, Line 21, "SPOT" should be -- SP4T --.

Signed and Sealed this
Seventeenth Day of May, 2022

Katherine Kelly Vidal
*Director of the United States Patent and Trademark Office*